United States Patent
Aitken et al.

(10) Patent No.: US 10,196,297 B2
(45) Date of Patent: *Feb. 5, 2019

(54) INTERMEDIATE THERMAL EXPANSION COEFFICIENT GLASS

(71) Applicant: Corsam Technologies LLC, Corning, NY (US)

(72) Inventors: Bruce Gardiner Aitken, Corning, NY (US); Carlo Anthony Kosik Williams, Painted Post, NY (US)

(73) Assignee: CORNING, INCORPORATED, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/013,417

(22) Filed: Feb. 2, 2016

(65) Prior Publication Data

US 2016/0145146 A1    May 26, 2016

Related U.S. Application Data

(63) Continuation of application No. 13/890,638, filed on May 9, 2013, now Pat. No. 9,266,769, which is a continuation-in-part of application No. 12/573,213, filed on Oct. 5, 2009, now Pat. No. 8,445,394, application No. 15/013,417, which is a continuation-in-part of application No. 13/305,051, filed on Nov. 28, 2011, now abandoned, and a continuation-in-part of application No. 13/569,756, filed on Aug. 8, 2012, now Pat. No. 8,975,199, and a continuation-in-part of application No. PCT/US2012/049718, filed on Aug. 6, 2012.

(60) Provisional application No. 61/103,126, filed on Oct. 6, 2008, provisional application No. 61/177,827, filed on May 13, 2009, provisional application No. 61/418,084, filed on Nov. 30, 2010, provisional application No. 61/503,248, filed on Jun. 30, 2011, provisional application No. 61/562,651, filed on Nov. 22, 2011, provisional application No. 61/522,956, filed on Aug. 12, 2011, provisional application No. 61/515,042, filed on Aug. 4, 2011, provisional application No. 61/565,050, filed on Nov. 30, 2011.

(51) Int. Cl.
    *C03C 3/091*    (2006.01)
    *H01L 31/0392*  (2006.01)
    *H01L 31/0272*  (2006.01)
    *C03C 3/064*    (2006.01)
    *C03C 3/066*    (2006.01)
    *C03C 3/087*    (2006.01)

(52) U.S. Cl.
    CPC ............ *C03C 3/091* (2013.01); *C03C 3/064* (2013.01); *C03C 3/066* (2013.01); *C03C 3/087* (2013.01); *H01L 31/0272* (2013.01); *H01L 31/0392* (2013.01); *H01L 31/03925* (2013.01); *Y02E 10/50* (2013.01)

(58) Field of Classification Search
    CPC ..................... C03C 3/087; C03C 3/091
    See application file for complete search history.

(56) References Cited

U.S. PATENT DOCUMENTS

| | | |
|---|---|---|
| 4,536,607 A | 8/1985 | Wiesmann |
| 5,304,516 A | 4/1994 | Clifford |
| 5,631,195 A | 5/1997 | Yanagisawa et al. |
| 5,780,373 A | 7/1998 | Yanagisawa et al. |
| 5,925,583 A | 7/1999 | Yoshii et al. |
| 6,063,718 A | 5/2000 | El Khiati et al. |
| 6,137,048 A | 10/2000 | Wu et al. |
| 6,187,150 B1 | 2/2001 | Yoshimi et al. |
| 6,207,603 B1 | 3/2001 | Danielson et al. |
| 6,268,304 B1 | 7/2001 | Maeda et al. |
| 6,313,052 B1 | 11/2001 | Nakashima et al. |
| 6,319,867 B1 | 11/2001 | Chacon et al. |
| 6,417,124 B1 | 7/2002 | Peuchert et al. |
| 6,465,381 B1 | 10/2002 | Lautenschlager et al. |
| 6,680,266 B1 | 1/2004 | Peuchert et al. |
| 6,707,526 B2 | 3/2004 | Peuchert et al. |
| 6,818,576 B2 | 11/2004 | Ikenishi et al. |
| RE38,959 E | 1/2006 | Kohli |
| 6,992,030 B2 | 1/2006 | Paulson |
| 7,087,541 B2 | 8/2006 | Kohli |
| 7,153,797 B2 | 12/2006 | Peuchert |
| 7,235,736 B1 | 6/2007 | Buller et al. |
| 7,297,868 B2 | 11/2007 | Bhattacharya |
| 7,666,511 B2 | 2/2010 | Ellison et al. |
| 7,670,975 B2 | 3/2010 | Suzuki et al. |
| 8,063,886 B2 | 11/2011 | Serban et al. |
| 8,399,370 B2 | 3/2013 | Niida et al. |
| 8,652,979 B2 | 2/2014 | Murata |
| 9,643,883 B2 * | 5/2017 | Aitken ............... C03C 3/097 |
| 2003/0087746 A1 | 5/2003 | Ritter et al. |
| 2006/0006786 A1 | 1/2006 | Fechner et al. |
| 2006/0038228 A1 | 2/2006 | Aitken et al. |
| 2007/0193623 A1 | 8/2007 | Krasnov |
| 2008/0020919 A1 | 1/2008 | Murata |
| 2008/0128020 A1 | 6/2008 | Zafar et al. |
| 2008/0130171 A1 | 6/2008 | Behan et al. |
| 2008/0206494 A1 | 8/2008 | Kurachi et al. |
| 2008/0308146 A1 | 12/2008 | Krasnov et al. |
| 2009/0270242 A1 | 10/2009 | Yanase et al. |
| 2009/0275462 A1 | 11/2009 | Murata |
| 2010/0084016 A1 * | 4/2010 | Aitken ............... C03C 3/091 |
| | | 136/258 |
| 2010/0288351 A1 | 11/2010 | Speit et al. |
| 2010/0288361 A1 | 11/2010 | Rudigier-Voigt et al. |

FOREIGN PATENT DOCUMENTS

| | | |
|---|---|---|
| CN | 101117270 | 2/2008 |
| JP | 64051346 A | 2/1989 |

(Continued)

OTHER PUBLICATIONS

KR10-2011-7010301 Office action dated Oct. 20, 2015.

(Continued)

*Primary Examiner* — Elizabeth A. Bolden

(57) ABSTRACT

CTE-matched silicate glasses and more particularly to low-alkali CTE-matched silicate glasses that are useful in semiconductor-based applications, such as photovoltaics are described along with methods of making such glasses.

15 Claims, 3 Drawing Sheets

(56) References Cited

FOREIGN PATENT DOCUMENTS

| | | |
|---|---|---|
| JP | H06263473 A | 9/1994 |
| JP | 2743333 | 4/1998 |
| JP | 11135819 | 5/1999 |
| JP | 11180727 | 7/1999 |
| JP | 11180728 | 7/1999 |
| JP | 11310433 | 11/1999 |
| JP | 11335133 | 12/1999 |
| JP | 2002025762 | 1/2002 |
| JP | 2002053340 | 2/2002 |
| JP | 2003261352 | 9/2003 |
| JP | 2004244257 | 9/2004 |
| JP | 2005139031 A | 6/2005 |
| JP | 2007256764 A | 10/2007 |
| JP | 2007284307 | 11/2007 |
| JP | 2008069021 | 3/2008 |
| JP | 2008280189 | 11/2008 |
| JP | 2008308343 | 12/2008 |
| KR | 20080033435 | 4/2008 |
| KR | 20080046671 A | 5/2008 |
| WO | 2008028599 | 3/2008 |
| WO | WO 2008149888 A1 * | 12/2008 ............. C03C 3/091 |

OTHER PUBLICATIONS

PCT/US2009/059067 Search Report dated Apr. 13, 2010.
PCT/US2009/059067 International Preliminary Report on Patentability dated Apr. 21, 2011.
KR Office action dated Nov. 23, 2017.
English Translation of JP2016019736 Office Action dated Oct. 3, 2017, Japan Patent Office, 2 Pgs.
English Translation of CN201510765082.3 Third Office Action dated Jun. 29, 2018, China Patent Office, 7 Pgs.

* cited by examiner

INTERMEDIATE THERMAL EXPANSION COEFFICIENT GLASS

CROSS-REFERENCE TO RELATED APPLICATIONS

This application is a continuation of U.S. patent application Ser. No. 13/890,638 filed on May 9, 2013, which is a Continuation-in-Part of U.S. application Ser. No. 12/573,213, which claims the benefit of priority to U.S. Prov. Appl. No. 61/103,126 filed on Oct. 6, 2008 and to U.S. Prov. Appl. No. 61/177,827 filed on May 13, 2009; Continuation-in-Part of U.S. application Ser. No. 13/305,051, which claims the benefit of priority to U.S. Prov. Appl. No. 61/418,084 filed on Nov. 30, 2010, U.S. Prov. Appl. No. 61/503,248 filed on Jun. 30, 2011, and U.S. Prov. Appl. No. 61/562,651 filed on Nov. 22, 2011; Continuation-in-Part of U.S. application Ser. No. 13/569,756, which claims the benefit of priority to U.S. Prov. Appl. No. 61/522,956 filed on Aug. 12, 2011; and Continuation-in-Part of PCT/US12/49718 which claims benefit of priority to U.S. Prov. Appl. No. 61/515,042 filed on Aug. 4, 2011 and U.S. Prov. Appl. No. 61/565,050 filed on Nov. 30, 2011, all of which are hereby incorporated by reference in their entirety.

BACKGROUND

Field

Embodiments relate generally to CTE-matched glasses and more particularly to low- to no-alkali aluminosilicate, borosilicate, and aluminoborosilicate glasses which may be useful in semiconductor-based applications, such as photovoltaics, photochromics, electrochromics, or Organic Light Emitting Diode (OLED) applications.

Technical Background

The fusion forming process typically produces flat glass with optimal surface and geometric characteristics useful for many electronics applications, for instance, substrates used in electronics applications, for example, display glass for LCD televisions.

Over the last 10 years, Corning fusion glass products include 1737F™, 1737G™ Eagle2000F™, EagleXG™, Jade™, and Gorilla Glass™. Efficient melting is generally believed to occur at a temperature corresponding to a melt viscosity of about 200 poise (P). These glasses share in common 200 P temperatures in excess of 1600° C., which can translate to accelerated tank and electrode corrosion, greater challenges for fining due to still more elevated finer temperatures, and/or reduced platinum system life time, particularly around the finer. Many have temperatures at 3000 P in excess of about 1300° C., and since this is a typical viscosity for an optical stirrer, the high temperatures at this viscosity can translate to excessive stirrer wear and elevated levels of platinum defects in the body of the glass.

Many of the above described glasses have delivery temperatures in excess of 1200° C., and this can contribute to creep of isopipe refractory materials, particularly for large sheet sizes.

These attributes combine so as to limit flow (because of slow melt rates), to accelerate asset deterioration, to force rebuilds on timescales much shorter than product lifetimes, to force unacceptable (arsenic), expensive (capsule) or unwieldy (vacuum fining) solutions to defect elimination, and thus contribute in significant ways to the cost of manufacturing glass.

In applications in which rather thick, comparatively low-cost glass with less extreme properties is required, these glasses are not only overkill, but prohibitively expensive to manufacture. This is particularly true when the competitive materials are made by the float process, a very good process for producing low cost glass with rather conventional properties. In applications that are cost sensitive, such as large-area photovoltaic panels and OLED lighting, this cost differential has been large enough to make the price point of LCD-type glasses unacceptable.

Competing with the cost constraints for is the continuing drive to make new technologies, like PV, competitive with existing power production methods, e.g., hydro, coal, nuclear, wind, etc., in the power generation industry. To do so, in addition to cost, manufacturers are looking at conversion efficiency, device lifetime, and efficiency degradation—design challenges that need to be addressed to make PV a viable alternative. Soda lime glass has been a common substrate for most PV panels because of its low cost. However, soda lime glasses are not ideal for PV modules, especially CdTe-based thin film PV modules as sodium can cause problems with efficiency and device lifetime. Further, soda lime glasses can have sodium release issues that occur due to environmental conditions. These problems can lead to delamination issues and reduced efficiency. Clearly, there is still an unmet need to find glass compositions that provide optimal substrates for thin film PV devices.

SUMMARY

A first aspect comprises a glass comprising about, in mol %, 60 to 65 percent $SiO_2$, 8 to 12 percent $Al_2O_3$, 7 to 15 percent $B_2O_3$, 0 to 8 percent $M_2O$, and 9 to 15 percent RO, wherein, M is an alkali metal and wherein, R is an alkaline earth metal, and the glass has a coefficient of thermal expansion of from about 4.0 to about 7.5 ppm/° C. from 25 to 300° C. In some embodiments, the glass has a coefficient of thermal expansion of from about 4.5 to about 6.5 ppm/° C. from 25 to 300° C. In some embodiments, the glass has a coefficient of thermal expansion of from about 4.5 to about 6.0 ppm/° C. from 25 to 300° C. In some embodiments, the glass comprises about 0.1 to 8 mol % $M_2O$. In some embodiments, the glass further comprises about 0.01 to 0.4 percent $SnO_2$.

In some embodiments, the glass described above comprises about, in mol %, 61 to 64 percent $SiO_2$, 8 to 12 percent $Al_2O_3$, 9 to 15 percent $B_2O_3$, greater than 0 to 4 percent $M_2O$, and 12 to 15 percent RO.

In some embodiments, the glass described above comprises about, in mol %, 60 to 65 percent $SiO_2$, 8 to less than 10 percent $Al_2O_3$, greater than 11 to 15 percent $B_2O_3$, greater than 0 to less than 1 percent $M_2O$, and 9 to 15 percent RO.

In other embodiments, the glass described above comprises about, in mol %, 60 to 65 percent $SiO_2$, 10 to 12 percent $Al_2O_3$, 7 to 11 percent $B_2O_3$, 1 to 8 percent $M_2O$, and 9 to 15 percent RO.

In other embodiments, the glass described above comprises about, in mol %, 62 to 65 percent $SiO_2$, 10 to 12 percent $Al_2O_3$, 7 to 11 percent $B_2O_3$, 3 to 8 percent MgO, 3 to 10 percent CaO, 3 to 8 percent SrO, and 1 to 8 percent $M_2O$, wherein, CaO/(CaO+SrO) is from 0.4 and 1.

A second aspect comprises a glass comprising about, in mol %, 20 to 70 percent $SiO_2$, 5 to 20 percent $Al_2O_3$, 0 to 15 percent $B_2O_3$, 0 to 1 percent $M_2O$, 0 to 10 percent MgO, 8 to 35 percent CaO, 0 to 16 percent SrO, 0 to 9 percent BaO, and 20 to 45 percent RO, wherein, M is an alkali metal and wherein, R is an alkaline earth metal, and the glass has a coefficient of thermal expansion of from about 4.0 to about 7.5 ppm/° C. from 25 to 300° C. In some embodiments, the glass has a coefficient of thermal expansion of from about 4.5 to about 6.5 ppm/° C. from 25 to 300° C. In some embodiments, the glass has a coefficient of thermal expansion of from about 4.5 to about 6.0 ppm/° C. from 25 to 300° C. In some embodiments, the glass comprises about, in mol %, 57 to 68 percent $SiO_2$, 5 to 12 percent $Al_2O_3$, 0 to 8 percent $B_2O_3$, 0 to 0.1 percent $M_2O$, 0 to 10 percent MgO, 8 to 28 percent CaO, 0 to 10 percent SrO, 0 to 9 percent BaO, and 21 to 32 percent RO, wherein M is an alkali metal and wherein, R is an alkaline earth metal, and the glass has a coefficient of thermal expansion of from about 4.0 to about 6.0 ppm/° C. from 25 to 300° C.

A third aspect comprises a glass comprising about, in mol %, 60 to 68 percent $SiO_2$, 8 to 11 percent $Al_2O_3$, 6 to 11 percent $B_2O_3$, 0 to 1 percent $M_2O$; 0 to 5 percent MgO, greater than 0 to 12 percent CaO, 1 to 12 percent SrO, 0 to 8 percent BaO, and 16 to 20 percent RO, wherein R is an alkaline earth metal, and M is an alkali metal, and the glass has a coefficient of thermal expansion of from about 4.0 to about 7.5 ppm/° C. from 25 to 300° C. In some embodiments, the glass has a coefficient of thermal expansion of from about 4.5 to about 6.5 ppm/° C. from 25 to 300° C. In some embodiments, the glass has a coefficient of thermal expansion of from about 4.5 to about 6.0 ppm/° C. from 25 to 300° C.

In some embodiments, the glasses described above are substantially free of BaO, $Sb_2O_3$, $As_2O_3$, or combinations thereof. In some embodiments, the glasses described above further comprises 2 mole percent or less of $TiO_2$, MnO, ZnO, $Nb_2O_5$, $MoO_3$, $Ta_2O_5$, $WO_3$, $ZrO_2$, $Y_2O_3$, $La_2O_3$, $P_2O_5$, or combinations thereof. In some embodiments, the glass is ion exchanged.

A fourth aspect comprises a photovoltaic ("PV") module, comprising a CdTe solar cell material, one or more conductive oxides, and a glass substrate, wherein the glass substrate has a coefficient of thermal expansion of from about 4.0 to about 7.5 ppm/° C. from 25 to 300° C. In some embodiments, the glass substrate has a coefficient of thermal expansion of from about 4.5 to about 6.0 ppm/° C. from 25 to 300° C.

In some embodiments, the glass substrate in the PV module comprises about, in mol %, 60 to 65 percent $SiO_2$, 8 to 12 percent $Al_2O_3$, 7 to 15 percent $B_2O_3$, 0 to 8 percent $M_2O$, and 9 to 15 percent RO, wherein, M is an alkali metal and wherein, R is an alkaline earth metal. In some embodiments, in the glass substrate in the PV module comprises, in mol %, 60 to 65 percent $SiO_2$, 8 to 12 percent $Al_2O_3$, 7 to 15 percent $B_2O_3$, 0.1 to 8 percent $M_2O$, 9 to 15 percent RO, and 0.01 to 0.4 percent $SnO_2$.

In some embodiments, the glass substrate in the PV module comprises about, in mol %, 20 to 70 percent $SiO_2$, 5 to 20 percent $Al_2O_3$, 0 to 15 percent $B_2O_3$, 0 to 1 percent $M_2O$, 0 to 10 percent MgO, 8 to 35 percent CaO, 0 to 16 percent SrO, 0 to 9 percent BaO, and 20 to 45 percent RO, wherein, M is an alkali metal and wherein, R is an alkaline earth metal.

In some embodiments, the glass substrate in the PV module comprises about, in mol %, 57 to 68 percent $SiO_2$, 5 to 12 percent $Al_2O_3$, 0 to 8 percent $B_2O_3$, 0 to 0.1 percent $M_2O$, 0 to 10 percent MgO, 8 to 28 percent CaO, 0 to 10 percent SrO, 0 to 9 percent BaO, and 21 to 32 percent RO, wherein, M is an alkali metal and wherein, R is an alkaline earth metal, and the glass has a coefficient of thermal expansion of from about 4.0 to about 6.0 ppm/° C. from 25 to 300° C.

In some embodiments, the glass substrate in the PV module comprises about, in mol %, 60 to 68 percent $SiO_2$, 8 to 11 percent $Al_2O_3$, 6 to 11 percent $B_2O_3$, 0 to 1 percent $M_2O$; 0 to 5 percent MgO, greater than 0 to 12 percent CaO, 1 to 12 percent SrO, 0 to 8 percent BaO, and 16 to 20 percent RO, wherein R is an alkaline earth metal, and M is an alkali metal.

A fifth aspect comprises a PV device, comprising a CdTe solar cell material having a coefficient of thermal expansion, one or more conductive oxides, and a glass substrate, wherein the glass substrate has a coefficient of thermal expansion that is within about ±2.0 ppm/° C. of the coefficient of thermal expansion of the CdTe solar cell material from 25 to 300° C. In some embodiments, the glass substrate in the PV module has a coefficient of thermal expansion of within about ±1.0 ppm/° C. of the coefficient of thermal expansion of the CdTe solar cell material from 25 to 300° C.

In some embodiments, the glass substrate in the PV device comprises about, in mol %, 60 to 65 percent $SiO_2$, 8 to 12 percent $Al_2O_3$, 7 to 15 percent $B_2O_3$, 0 to 8 percent $M_2O$, and 9 to 15 percent RO, wherein, M is an alkali metal and wherein, R is an alkaline earth metal. In some embodiments, in the glass substrate in the PV module comprises, in mol %, 60 to 65 percent $SiO_2$, 8 to 12 percent $Al_2O_3$, 7 to 15 percent $B_2O_3$, 0.1 to 8 percent $M_2O$, 9 to 15 percent RO, and 0.01 to 0.4 percent $SnO_2$.

In some embodiments, the glass substrate in the PV device comprises about, in mol %, 20 to 70 percent $SiO_2$, 5 to 20 percent $Al_2O_3$, 0 to 15 percent $B_2O_3$, 0 to 1 percent $M_2O$, 0 to 10 percent MgO, 8 to 35 percent CaO, 0 to 16 percent SrO, 0 to 9 percent BaO, and 20 to 45 percent RO, wherein, M is an alkali metal and wherein, R is an alkaline earth metal.

In some embodiments, the glass substrate in the PV device comprises about, in mol %, 57 to 68 percent $SiO_2$, 5 to 12 percent $Al_2O_3$, 0 to 8 percent $B_2O_3$, 0 to 0.1 percent $M_2O$, 0 to 10 percent MgO, 8 to 28 percent CaO, 0 to 10 percent SrO, 0 to 9 percent BaO, and 21 to 32 percent RO, wherein, M is an alkali metal and wherein, R is an alkaline earth metal, and the glass has a coefficient of thermal expansion of from about 4.0 to about 6.0 ppm/° C. from 25 to 300° C.

In some embodiments, the glass substrate in the PV device comprises about, in mol %, 60 to 68 percent $SiO_2$, 8 to 11 percent $Al_2O_3$, 6 to 11 percent $B_2O_3$, 0 to 1 percent $M_2O$; 0 to 5 percent MgO, greater than 0 to 12 percent CaO, 1 to 12 percent SrO, 0 to 8 percent BaO, and 16 to 20 percent RO, wherein R is an alkaline earth metal, and M is an alkali metal.

Additional features and advantages will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings illustrate one or more embodiment(s) of the invention and together with the description serve to explain the principles and operation of the invention.

BRIEF DESCRIPTION OF THE DRAWINGS

The invention can be understood from the following detailed description either alone or together with the accompanying drawing figures.

DETAILED DESCRIPTION

Figure 1:
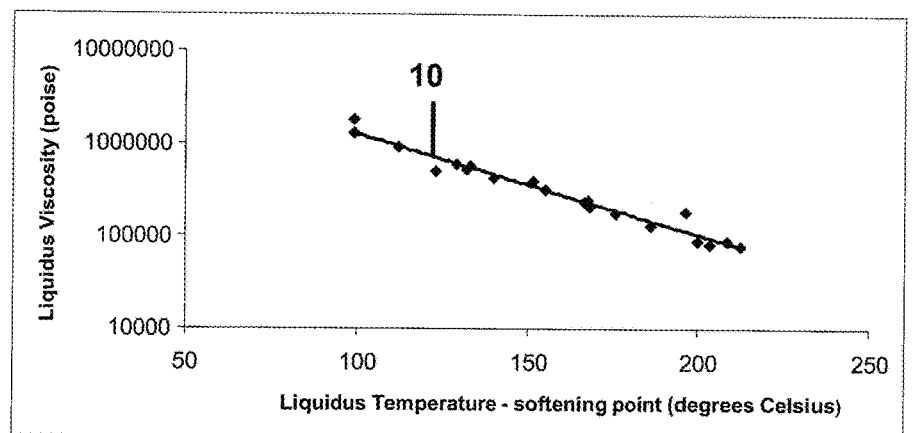
FIG. 1 is a graph of estimated liquidus viscosity.

Reference will now be made in detail to various embodiments of the invention. Wherever possible, the same reference numbers will be used throughout the drawings to refer to the same or like features.

In the following detailed description, numerous specific details may be set forth in order to provide a thorough understanding of embodiments of the invention. However, it will be clear to one skilled in the art when embodiments of the invention may be practiced without some or all of these specific details. In other instances, well-known features or processes may not be described in detail so as not to unnecessarily obscure the invention. In addition, like or identical reference numerals may be used to identify common or similar elements. Moreover, unless otherwise defined, all technical and scientific terms used herein have the same meaning as commonly understood by one of ordinary skill in the art to which this invention belongs. In case of conflict, the present specification, including the definitions herein, will control.

Although other methods and can be used in the practice or testing of the invention, certain suitable methods and materials are described herein.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein.

Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and/or C; D, E, and/or F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and/or C; D, E, and/or F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

Moreover, where a range of numerical values is recited herein, comprising upper and lower values, unless otherwise stated in specific circumstances, the range is intended to include the endpoints thereof, and all integers and fractions within the range. It is not intended that the scope of the invention be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; more specifically, the phrase "A or B" means "A, B, or both A and B". Exclusive "or" is designated herein by terms such as "either A or B" and "one of A or B", for example.

The indefinite articles "a" and "an" are employed to describe elements and components of the invention. The use of these articles means that one or at least one of these elements or components is present. Although these articles are conventionally employed to signify that the modified noun is a singular noun, as used herein the articles "a" and an also include the plural, unless otherwise stated in specific instances. Similarly, the definite article "the", as used herein, also signifies that the modified noun may be singular or plural, again unless otherwise stated in specific instances.

For the purposes of describing the embodiments, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the claimed invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

It is noted that one or more of the claims may utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

As a result of the raw materials and/or equipment used to produce the glass composition of the present invention, certain impurities or components that are not intentionally added, can be present in the final glass composition. Such materials are present in the glass composition in minor amounts and are referred to herein as "tramp materials."

As used herein, a glass composition having 0 wt % of a compound is defined as meaning that the compound, molecule, or element was not purposefully added to the composition, but the composition may still comprise the compound, typically in tramp or trace amounts. Similarly, "sodium-free," "alkali-free," "potassium-free" or the like are defined to mean that the compound, molecule, or element was not purposefully added to the composition, but the composition may still comprise sodium, alkali, or potassium, but in approximately tramp or trace amounts.

It has been found that the CTE of the super/substrate glass for CdTe thin-film photovoltaic modules should match, or be as closely matched as possible, to the CTE of the semiconductor film so as to minimize the level of stress in said film and consequently optimize the efficiency of the photovoltaic module. The compositions described herein specifies a glass super/substrate having a CTE in the range that is optimum for minimizing the resultant stress in the semiconductor layers of CdTe devices and provide improved conversion efficiency in the resulting devices.

The terms "solar cell," "photovoltaic cell," "PV cell," "solar module," "photovoltaic module," "PV module," "solar device," "photovoltaic device," "PV device," or "device," as used herein, refer to any article that can convert light into electrical energy. Suitable solar cells include wafer-based solar cells (e.g., solar cells comprising materials selected from crystalline-Si (c-Si), ribbon Si, or multicrystalline-Si (mc-Si)(also called polycrystalline Si), and mixtures thereof). A solar cell assembly can comprise one or a plurality of solar cells. The plurality of solar cells can be electrically interconnected or arranged in a flat plane. In addition, the solar cell assembly can further comprise conductive pastes or electrical wirings deposited upon the solar cells.

As used herein, the term "substrate" can be used to describe either a substrate or a superstrate depending on the configuration of the photovoltaic cell. For example, the substrate is a superstrate, if when assembled into a photovoltaic cell, it is on the light incident side of a photovoltaic cell. The superstrate can provide protection for the photovoltaic materials from impact and environmental degradation while allowing transmission of the appropriate wavelengths of the solar spectrum. Further, multiple photovoltaic cells can be arranged into a photovoltaic module.

As used herein, the term "adjacent" can be defined as being in close proximity. Adjacent structures may or may not be in physical contact with each other. Adjacent structures can have other layers and/or structures disposed between them.

As used herein, the term "planar" can be defined as having a substantially topographically flat surface.

Although exemplary numerical ranges are described in the embodiments, each of the ranges can include any numerical value including decimal places within the range including each of the ranges endpoints.

As used herein, multivalent components of the exemplary compositions are represented, for example, as $Fe_2O_3$, $SnO_2$, $As_2O_5$, $Sb_2O_5$. These materials are batched as said oxides but mixed valences or alternative valences could be used.

In the broadest terms, the glass compositions described here have a strain point of 600° C. or greater and a CTE that is matched to a CdTe thin film to be coated thereon. In some embodiments, "matched," as used herein, mean the CTE of the glass substrate is equivalent to within ±2, ±1.5, ±1.0, ±0.75, ±0.5, or ±0.25 ppm/° C. of the CTE of a CdTe thin film to be coated thereon. In some embodiments, the CTE of the glass substrate is from about 4 ppm/° C. to about 8 ppm/° C., from about 4.5 ppm/° C. to about 8 ppm/° C., from about 4.5 ppm/° C. to about 7 ppm/° C., from about 4.5 ppm/° C. to about 6.5 ppm/° C., from about 5 ppm/° C. to about 7 ppm/° C., from about 5.5 ppm/° C. to about 6.5 ppm/° C., from about 4 ppm/° C. to about 7 ppm/° C., from about 4 ppm/° C. to about 6.5 ppm/° C., from about 5 ppm/° C. to about 8 ppm/° C., or from about 5.5 ppm/° C. to about 8 ppm/° C. In some embodiments, the CTE of the glass substrate is about 4, 4.5, 5, 5.5, 5.75, 6.0, 6.5, 7, 7.5, or 8 ppm/° C.

Accordingly, in one embodiment, the glass has a strain point of 600° C. or greater, for example, 620° C. or greater. In some embodiments, the glass has a coefficient of thermal expansion of $38 \times 10^{-7}$ or greater, for example, $40 \times 10^{-7}$ or greater, for example, $45 \times 10^{-7}$ or greater.

The glass according to one embodiment can have a strain point of 620° C. or greater and/or a coefficient of thermal expansion of $45 \times 10^{-7}$ or greater.

In some embodiments, the CTE of the CdTe thin film comprises an average value for a CdTe thin film. In some embodiments, the CTE of the CdTe thin film comprises a specific CTE value for the CdTe film which results from the composition, substrate, other components, manufacturing or deposition process.

A first aspect comprises a glass comprising, in mole percent, about:
  20 to 70 percent $SiO_2$;
  5 to 20 percent $Al_2O_3$;
  0 to 15 percent $B_2O_3$;
  0 to 1 percent $M_2O$;
  0 to 10 percent MgO;
  8 to 35 percent CaO;
  0 to 16 percent SrO;
  0 to 9 percent BaO; and
  20 to 45 percent RO;
wherein, M is an alkali metal and wherein, R is an alkaline earth metal.

In some embodiments, the glass comprises, in mole percent, about:
  57 to 68 percent $SiO_2$;
  5 to 12 percent $Al_2O_3$;
  0 to 8 percent $B_2O_3$;

0 to 0.1 percent $M_2O$;
0 to 10 percent MgO;
8 to 28 percent CaO;
0 to 10 percent SrO;
0 to 9 percent BaO; and
21 to 32 percent RO;
wherein, M is an alkali metal and wherein, R is an alkaline earth metal.

A second aspect comprises a glass comprising, in mole percent, about:
60 to 65 percent $SiO_2$;
8 to 12 percent $Al_2O_3$;
7 to 15 percent $B_2O_3$;
greater than 0 to 8 percent $M_2O$; and
9 to 15 percent RO;
wherein, M is an alkali metal and wherein, R is an alkaline earth metal. According to another embodiment, the glass is substantially free of BaO. For example, the content of BaO can be 0.05 mole percent or less, for example, zero mole percent. In another embodiment, the glass comprises 0.01 to 0.4 mole percent $SnO_2$.

In some embodiment, the glass comprises, in mole percent, about:
61 to 64 percent $SiO_2$;
8 to 12 percent $Al_2O_3$;
9 to 15 percent $B_2O_3$;
greater than 0 to 4 percent $M_2O$; and
12 to 15 percent RO;
wherein, M is an alkali metal and wherein, R is an alkaline earth metal.

In some embodiment, the glass comprises, in mole percent, about:
60 to 65 percent $SiO_2$;
8 to less than 10 percent $Al_2O_3$;
greater than 11 to 15 percent $B_2O_3$;
greater than 0 to less than 1 percent $M_2O$; and
9 to 15 percent RO;
wherein, M is an alkali metal and wherein, R is an alkaline earth metal.

In some embodiment, the glass comprises, in mole percent, about:
60 to 65 percent $SiO_2$;
10 to 12 percent $Al_2O_3$;
7 to 11 percent $B_2O_3$;
1 to 8 percent $M_2O$; and
9 to 15 percent RO;
wherein, M is an alkali metal and wherein, R is an alkaline earth metal.

In some embodiment, the glass comprises, in mole percent, about:
62 to 65 percent $SiO_2$;
10 to 12 percent $Al_2O_3$;
7 to 11 percent $B_2O_3$;
3 to 8 percent MgO;
3 to 10 percent CaO;
3 to 8 percent SrO; and
1 to 8 percent $M_2O$;
wherein, M is an alkali metal selected from K, Na, and combinations thereof and wherein, CaO/(CaO+SrO) is from 0.4 to 1.

A third aspect comprises a glass comprising, in mole percent, about:
60 to 68 percent $SiO_2$;
8 to 11 percent $Al_2O_3$;
6 to 11 percent $B_2O_3$;
0 to 1 percent $M_2O$;
0 to 5 percent MgO;
greater than 0 to 12 percent CaO;
1 to 12 percent SrO;
0 to 8 percent BaO; and
16 to 20 percent RO;
wherein R is an alkaline earth metal, and M is an alkali metal. In some embodiments, the M2O is from 0 to about 0.1 mole percent.

In some embodiments, M is an alkali metal selected from Li, Na, K, Rb, Cs, and a combination thereof. In some embodiments, M is selected from Li, K, Cs, and a combination thereof. In one embodiment, R is selected from Mg, Ca, Sr, Ba, and a combination thereof. In some embodiments, R is selected from Mg, Ca, Sr, and a combination thereof.

$SiO_2$, an oxide involved in the formation of glass, functions to stabilize the networking structure of glass. In some embodiments, the glass composition comprises from about 20 to about 70 mol % $SiO_2$. In some embodiments, the glass composition comprises from about 57 to about 68 mol % $SiO_2$. In some embodiments, the glass composition can comprise from about 60 to about 68 mol % $SiO_2$. In some embodiments, the glass composition can comprise from about 60 to about 65 mol % $SiO_2$. In some embodiments, the glass composition can comprise from about 61 to about 64 mol % $SiO_2$. In some embodiments, the glass composition can comprise from about 62 to about 65 mol % $SiO_2$. In some embodiments, the glass composition can comprise from about 20 to about 70 mol %, about 20 to about 68 mol %, about 20 to about 65 mol %, about 20 to about 64 mol %, about 20 to 60 mol %, about 20 to 50 mol %, about 20 to about 40 mol %, about 20 mol % to about 30 mol %, about 30 to about 70 mol %, about 30 to about 68 mol %, about 30 to about 65 mol %, about 30 to about 64 mol %, about 30 to 60 mol %, about 30 to 50 mol %, about 30 to about 40 mol %, about 40 to about 70 mol %, about 40 to about 68 mol %, about 40 to about 65 mol %, about 40 to about 64 mol %, about 40 to 60 mol %, about 40 to 50 mol %, about 50 to about 70 mol %, about 50 to about 68 mol %, about 50 to about 65 mol %, about 50 to about 64 mol %, about 50 to 60 mol %, about 60 to about 70 mol %, about 60 to about 68 mol %, about 60 to about 65 mol %, about 60 to about 64 mol %, about 61 to about 70 mol %, about 61 to about 68 mol %, about 61 to about 65 mol %, or about 61 to about 64 mol %. In some embodiments, the glass composition comprises about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 mol % $SiO_2$.

$Al_2O_3$ may provide for a) maintaining the lowest possible liquidus temperature, b) lowering the expansion coefficient, or c) enhancing the strain point. In some embodiments, the glass composition can comprise from about 5 to about 20 mol % $Al_2O_3$. In some embodiments, the glass composition can comprise from 5 to about 12 mol % $Al_2O_3$. In some embodiments, the glass composition can comprise from about 8 to about 12 mol % $Al_2O_3$. In some embodiments, the glass composition can comprise from about 8 to about 11 mol % $Al_2O_3$. In some embodiments, the glass composition can comprise from about 8 to about 10 mol % $Al_2O_3$. In some embodiments, the glass composition can comprise from about 10 to about 12 mol % $Al_2O_3$. In some embodiments, the glass can comprise from about 5 to about 20 mol %, about 5 to about 15 mol %, about 5 to about 12 mol %, about 5 to about 11 mol %, about 5 to about 10 mol %, 8 to about 20 mol %, about 8 to about 15 mol %, about 8 to about 15 mol %, about 8 to about 12 mol %, about 8 to about 11 mol %, about 8 to about 10 mol %, about 10 to about 20 mol %, about 10 to about 15 mol %, about 10 to about 12 mol %, about 10 to about 11 mol %, or about 15 to about 20 mol % $Al_2O_3$. In some embodiments, the glass composition can comprise about 5, 6, 7, 8, 9, 10, 11, 12, 13, 14, 15, 16, 17, 18, 19, or 20 mol % $Al_2O_3$.

$B_2O_3$ can be used as a flux to soften glasses, making them easier to melt. $B_2O_3$ may also react with non-bridging oxygen atoms (NBOs), converting the NBOs to bridging oxygen atoms through the formation of $BO_4$ tetrahedra, which increases the toughness of the glass by minimizing the number of weak NBOs. $B_2O_3$ also lowers the hardness of the glass which, when coupled with the higher toughness, decreases the brittleness, thereby resulting in a mechanically durable glass, which can be advantageous for substrates used in photovoltaic applications. In some embodiments, the glass composition can comprise from 0 to about 15 mol % $B_2O_3$. In some embodiments, the glass composition can comprise from 0 to about 8 mol % $B_2O_3$. In some embodiments, the glass composition can comprise from about 7 to about 15 mol % $B_2O_3$. In some embodiments, the glass composition can comprise from about 9 to about 15 mol % $B_2O_3$. In some embodiments, the glass composition can comprise from about 11 to about 15 mol % $B_2O_3$. In some embodiments, the glass composition can comprise from about 7 to about 11 mol % $B_2O_3$. In some embodiments, the glass composition can comprise from about 6 to about 11 mol % $B_2O_3$. As mentioned above, the glasses, according some embodiments, comprise 7 to 15 mole percent, for example, 7 to 11 mole percent $B_2O_3$. In some embodiments, the glass composition can comprise from 0 to about 15 mol %, 0 to 12 mol %, 0 to 11 mol %, 0 to about 10 mol %, about 5 to about 15 mol %, about 5 to about 12 mol %, about 5 to about 11 mol %, about 5 to about 10 mol %, about 6 to about 15 mol %, about 6 to about 12 mol %, about 6 to about 11 mol %, about 6 to about 10 mol %, about 7 to about 15 mol %, about 7 to about 12 mol %, about 7 to about 11 mol %, about 7 to about 10 mol %, about 9 to about 15 mol %, about 9 to about 12 mol %, about 9 to about 11 mol %, about 9 to about 10 mol %, about 10 to about 15 mol %, about 10 to about 12 mol %, about 10 to about 11 mol %, about 11 to about 15 mol %, about 11 to about 12 mol %, or about 12 to about 15 mol %, $B_2O_3$. In some embodiments, the glass composition can comprise about 0, 1, 2, 3, 4, 5, 6, 7, 8, 9, 10, 11, 12, 13, 14, or 15 mol % $B_2O_3$.

Also as mentioned above, the glasses, according to some embodiments, 9 to 45 mole percent RO wherein, R is an alkaline earth metal. Since MgO, CaO and BaO are effective in decreasing the viscosity of glass at a higher temperature and enhancing the viscosity of glass at a lower temperature, they may be used for the improvement of the melting property and enhancement of the strain point. However, if excessive amounts of both MgO and CaO are used, there is an increasing trend toward phase separation and devitrification of the glass. As defined herein, RO comprises the mol % of MgO, CaO, SrO, and BaO. In some embodiments, the glass composition can comprise from 20 to about 45 mol % RO. In some embodiments, the glass composition can comprise from 21 to about 32 mol % RO. In some embodiments, the glass composition can comprise from 9 to about 15 mol % RO. In some embodiments, the glass composition can comprise from about 12 to about 15 mol % RO. In some embodiments, the glass composition can comprise from about 16 to about 20 mol % RO. In some embodiments, the glass composition can comprise from about 9 to about 45 mol %, about 9 to about 40 mol %, about 9 to about 35 mol %, about 9 to about 32 mol %, about 9 to about 30 mol %, about 9 to 25 mol %, about 9 to about 20 mol %, about 9 to about 15 mol %, about 12 to about 45 mol %, about 12 to about 40 mol %, about 12 to about 35 mol %, about 12 to about 32 mol %, about 12 to about 30 mol %, about 12 to about 25 mol %, about 12 to about 20 mol %, about 12 to about 15 mol %, about 16 to about 45 mol %, about 16 to about 40 mol %, about 16 to about 35 mol %, about 16 to about 32 mol %, about 16 to about 25 mol %, about 16 to about 20 mol %, about 20 to about 45 mol %, about 20 to about 40 mol %, about 20 to about 35 mol %, about 20 to about 32 mol %, about 20 to about 30 mol %, about 20 to about 25 mol %, about 21 to about 45 mol %, about 21 to about 40 mol %, about 21 to about 35 mol %, about 21 to about 32 mol %, about 21 to about 30 mol %, about 25 to about 45 mol %, about 25 to about 40 mol %, about 25 to about 35 mol %, about 25 to about 32 mol %, about 25 to about 30 mol %, about 30 to about 45 mol %, about 30 to about 40 mol %, about 30 to about 35 mol %, about 30 to about 32 mol %, about 32 to about 45 mol %, about 32 to about 40 mol %, about 32 to about 35 mol %, about 35 to about 45 mol %, about 35 to about 40 mol %, or about 40 to about 45 mol % RO. In some embodiments, the glass composition can comprise about 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, or 45 mol % RO.

In some embodiments, MgO can be added to the glass to reduce melting temperature, increase strain point, or adjust CTE when used in combination with other alkaline earth compounds (e.g., CaO, SrO, and BaO). It can disadvantageously lower CTE relative to other alkaline earths (e.g., CaO, SrO, BaO), and so other adjustments may be made to keep the CTE within the desired range. Examples of suitable adjustments include increase SrO at the expense of CaO, increasing alkali oxide concentration, and replacing a smaller alkali oxide (e.g., $Na_2O$) in whole or in part with a larger alkali oxide (e.g., $K_2O$). In some embodiments, the glass can comprise about 0 to about 10 mol % MgO. The glass can comprise, for example, 1 to 8 mole percent MgO. In some embodiments, the glass composition can comprise greater than 0 to about 5 mol % MgO. In some embodiments, the glass composition can comprise about 3 to about 8 mol % MgO. In some embodiments, the glass composition can comprise 0 to about 10 mol %, 0 to about 8 mol %, 0 to about 5 mol %, 0 to about 4 mol %, 0 to about 3 mol %, 0 to about 2 mol %, 0 to about 1 mol %, about 3 to about 10 mol %, about 3 to about 8 mol %, about 3 to about 5 mol %, about 5 to about 10 mol %, about 5 to about 8 wt, or about 7 to about 10 mol % MgO. In some embodiments, the glass compositions can comprise about 0, 1, 2, 3, 4, 5, 6, 7, 8, 9, or 10 mol % MgO.

In some embodiments, CaO can contribute to higher strain point, lower density, and lower melting temperature. More generally, it can be a component of certain possible devitrification phases, particularly anorthite ($CaAl_2Si_2O_8$), and this phase has complete solid solution with an analogous sodium phase, albite ($NaAlSi_3O_8$). High Na and Ca contents taken alone can cause liquidus temperatures to be unacceptably high. However, CaO sources include limestone, an inexpensive material, so to the extent that volume and low cost are factors, in some embodiments it is can be useful to make the CaO content as high as can be reasonably achieved relative to other alkaline earth oxides. In some embodiments, the glass composition about from 0 to about 35 mol % CaO. In some embodiments, the glass composition about from 8 to about 35 mol % CaO. In some embodiments, the glass composition can comprise from 8 to about 28 mol % CaO. In some embodiments, the glass composition can comprise from 0 to about 12 mol % CaO. In some embodiments, the glass composition can comprise from >0 to about 12 mol % CaO. In some embodiments, the glass composition can comprise from about 3 to about 10 mol % CaO. In some embodiments, the glass composition can comprise from 0 to about 35 mol %, 0 to about 30 mol %, 0 to about 28 mol %, 0 to 25 mol %, 0 to 20 mol %, 0 to about 15 mol %, 0 to about 12 mol %, 0 to about 10 mol %, 0 to about 5 mol %, about 3 to about 35 mol %, about 3 to about 30 mol %, about 3 to about 28 mol %, about 3 to about 25 mol %, about 3 to about 20 mol %, about 3 to about 15 mol %, about 3 to about 12 mol %, about 3 to about 10 mol %, about 8 to about 35 mol %, about 8 to about 30 mol %, about 8 to about 28 mol %, about 8 to about 25 mol %, about 8 to about 20 mol %, about 8 to about 15 mol %, about 8 to about 12 mol %, about 8 to about 10 mol %, about 10 to about 35 mol %, about 10 to about 30 mol %, about 10 to about 25 mol %, about 10 to about 20 mol %, about 10 to about 15 mol %, about 10 to about 12 mol %, about 15 to about 35 mol %, about 15 to about 30 mol %, about 15 to about 28 mol %, about 15 to about 25 mol %, about 15 to about 20 mol %, about 20 to about 35 mol %, about 20 to about 30 mol %, about 20 to about 28 mol %, about 20 to about 28 mol %, about 25 to about 35 mol %, about 25 to about 30 mol %, about 25 to about 28 mol %, about 28 to about 35 mol %, about 28 to about 30 mol %, about 28 to about 30 mol %, or about 30 to about 35 mol % CaO. In some embodiments, the glass composition can comprise about 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, or 35 mol % CaO.

SrO can contribute to higher coefficient of thermal expansion, and the relative proportion of SrO and CaO can be manipulated to improve liquidus temperature, and thus liquidus viscosity. In some embodiments, the glass can comprise from 0 to about 16 mol % SrO. In some embodiments, the glass can comprise from 0 to about 10 mol % SrO. In some embodiments, the glass can comprise from 1 to about 12 mol % SrO. In other embodiments, the glass can comprise greater than 0 to about 16 mol % SrO. The glasses can comprise, in some embodiments, 0 to 5 mole percent SrO. In certain embodiments, the glass contains no deliberately batched SrO, though it may be present as a contaminant in other batch materials. In some embodiments, the glass composition can comprise from 0 to about 16 mol %, 0 to about 15 mol %, 0 to about 12 mol %, 0 to about 10 mol %, 0 to about 8 mol %, 0 to about 5 mol %, 0 to about 3 mol %, about 3 to about 16 mol %, about 3 to about 15 mol %, about 3 to about 12 mol %, about 3 to about 10 mol %, about 3 to about 8 mol %, about 3 to about 5 mol %, about 5 to about 16 mol %, about 5 to about 15 mol %, about 5 to about 12 mol %, about 5 to about 10 mol %, about 5 to about 8 mol %, about 8 to about 16 mol %, about 8 to about 15 mol %, about 8 to about 12 mol %, about 8 to about 10 mol %, about 10 to about 16 mol %, about 10 to about 15 mol %, about 10 to about 12 mol %, about 12 to about 16 mol %, about 12 to about 15 mol %, or about 15 to about 16 mol %, SrO. In some embodiments, the glass composition can comprise about 0, 1, 2, 3, 4, 5, 6, 7, 8, 9, 10, 11, 12, 13, 14, 15, or 16 mol % SrO.

In some embodiments, the ratio CaO/(CaO+SrO) is advantageously kept between 0.4 and 1 to obtain a good balance between liquidus temperature (and hence liquidus viscosity) and melting temperature. For example, compositions with low alkali concentrations and high SrO concentrations have comparatively high melting temperatures, and if SrO is too high then liquidus temperatures may be elevated as well relative to glasses with more alkali oxide and lower SrO. However, for fixed concentrations of all other components, a local minimum in liquidus temperature is often obtained for CaO/(CaO+SrO) ratios between 0.4 and 1.

The glasses, according to some embodiments, comprise BaO. In certain embodiments, the glasses comprise less than 0.1 mole percent of BaO. In some embodiments, the glass composition can comprise from 0 to 10 mol % BaO. In some embodiments, the glass composition can comprise from 0 to 9 mol % BaO. In some embodiments, the glass composition can comprise from about greater than 0 to about 10 mol % BaO. In some embodiments, the glass composition can comprise from >0 to 8 mol % BaO. In some embodiments, the glass composition can comprise 0 to about 10 mol %, 0 to about 9 mol %, 0 to about 8 mol %, 0 to about 5 mol %, 0 to about 3 mol %, about 3 to about 10 mol %, about 3 to about 9 mol %, about 3 to about 8 mol %, about 3 to about 5 mol %, about 5 to about 10 mol %, about 5 to about 9 mol %, about 5 to about 8 mol %, about 8 to about 9 mol %, about 8 to about 10 mol %, or about 9 to about 10 mol % BaO. In some embodiments, the glass composition comprises about 0, 1, 2, 3, 4, 5, 6, 7, 8, 9, or 10 mol % BaO Generally, alkali cations can raise the CTE steeply, but also can lower the strain point and, depending upon how they are added, they can increase melting temperatures. The least effective alkali oxide for raising CTE is $Li_2O$, and the most effective alkali oxide for raising CTE is $Cs_2O$. In some embodiments, the glass composition can comprise from 0 to about 8 mol % $M_2O$, wherein M is one or more of the alkali cations Na, Li, K, Rb, and Cs. In some embodiments, the glass composition can comprise from greater than 0 to about 8 mol % $M_2O$. In some embodiments, the glass composition can comprise from greater than 0 to about 4 mol % $M_2O$. In some embodiments, the glass composition can comprise from greater than 0 to about 1 mol % $M_2O$. In some embodiments, $M_2O$ can comprise only trace amounts of $Na_2O$. In some embodiments, $M_2O$ can comprise only trace amounts of $Na_2O$ and $K_2O$. In certain embodiments, the alkalis in question can be Li, K and Cs or combinations thereof. In some embodiments, the glass composition is substantially alkali free, for example, the content of alkali metal can be about 1 weight percent or less, 0.5 weight percent or less, 0.25 mol % or less, 0.1 mol % or less or 0.05 mol % or less. In some embodiments, $M_2O$ is essentially 0 mol % or is only present in tramp amounts. The glass, according to some embodiments, can be substantially free of intentionally added alkali cations, compounds, or metals. In some embodiments, the glass composition can comprises from 0 to about 8 mol %, 0 to about 7 mol %, 0 to about 6 mol %, 0 to about 5 mol %, 0 to about 4 mol %, 0 to about 3 mol %, 0 to about 2 mol %, 0 to about 1 mol %, >0 to about 8 mol %, >0 to about 7 mol %, >0 to about 6 mol %, >0 to about 5 mol %, >0 to about 4 mol %, >0 to about 3 mol %, >0 to about 2 mol %, >0 to about 1 mol %, about 1 to about 8 mol %, about 1 to about 7 mol %, about 1 to about 6 mol %, about 1 to about 5 mol %, about 1 to about 4 mol %, about 1 to about 3 mol %, about 1 to about 2 mol %, about 2 to about 8 mol %, about 2 to about 7 mol %, about 2 to about 6 mol %, about 2 to about 5 mol %, about 2 to about 4 mol %, about 2 to about 3 mol %, about 3 to about 8 mol %, about 3 to about 7 mol %, about 3 to about 6 mol %, about 3 to about 5 mol %, about 3 to about 4 mol %, about 4 to about 8 mol %, about 4 to about 7 mol %, about 4 to about 6 mol %, about 4 to about 5 mol %, about 5 to about 8 mol %, about 5 to about 7 mol %, about 5 to about 6 mol %, about 6 to about 8 mol %, about 6 to about 7 mol %, or about 7 to about 8 mol % $M_2O$. In some embodiments, the glass compositions can comprise about 0, 1, 2, 3, 4, 5, 6, 7, or 8 mol % $M_2O$.

Sodium can be a mobile element or ion commonly used in standard window soda-lime glass compositions. The mobility of sodium can be problematic for the long-term reliability of PV modules since over the life of a PV module sodium can drift out of the glass under an applied field and migrate onto the active device layers of the module and degrade performance over time. In some embodiments, the glass is substantially sodium free. In some embodiments, the glass comprises 0.5 weight percent or less, 0.25 mol % or less, 0.1 mol % or less, about 0.05 mol % or less, or 0.001 mol % or less.

In alternative embodiments, sodium can be present from 0 to about 8 mol %. In some embodiments, the glass composition can comprises from 0 to about 8 mol %, 0 to about 7 mol %, 0 to about 6 mol %, 0 to about 5 mol %, 0 to about 4 mol %, 0 to about 3 mol %, 0 to about 2 mol %, 0 to about 1 mol %, >0 to about 8 mol %, >0 to about 7 mol %, >0 to about 6 mol %, >0 to about 5 mol %, >0 to about 4 mol %, >0 to about 3 mol %, >0 to about 2 mol %, >0 to about 1 mol %, about 1 to about 8 mol %, about 1 to about 7 mol %, about 1 to about 6 mol %, about 1 to about 5 mol %, about 1 to about 4 mol %, about 1 to about 3 mol %, about 1 to about 2 mol %, about 2 to about 8 mol %, about 2 to about 7 mol %, about 2 to about 6 mol %, about 2 to about 5 mol %, about 2 to about 4 mol %, about 2 to about 3 mol %, about 3 to about 8 mol %, about 3 to about 7 mol %, about 3 to about 6 mol %, about 3 to about 5 mol %, about 3 to about 4 mol %, about 4 to about 8 mol %, about 4 to about 7 mol %, about 4 to about 6 mol %, about 4 to about 5 mol %, about 5 to about 8 mol %, about 5 to about 7 mol %, about 5 to about 6 mol %, about 6 to about 8 mol %, about 6 to about 7 mol %, or about 7 to about 8 mol % $Na_2O$. In some embodiments, the glass compositions can comprise about 0, 1, 2, 3, 4, 5, 6, 7, or 8 mol % $Na_2O$.

As in the case of sodium, potassium is also an element or ion commonly found in standard window soda-lime glass compositions that has substantial mobility and may drift out of the glass. In some embodiments, the glass is substantially potassium free. In some embodiments, the glass comprises 0.5 weight percent or less, 0.25 mol % or less, 0.1 mol % or less, about 0.05 mol % or less, or 0.001 mol % or less.

In alternative embodiments, potassium can be present from 0 to about 8 mol %. In some embodiments, the glass can comprises from 0 to about 8 mol %, 0 to about 7 mol %, 0 to about 6 mol %, 0 to about 5 mol %, 0 to about 4 mol %, 0 to about 3 mol %, 0 to about 2 mol %, 0 to about 1 mol %, >0 to about 8 mol %, >0 to about 7 mol %, >0 to about 6 mol %, >0 to about 5 mol %, >0 to about 4 mol %, >0 to about 3 mol %, >0 to about 2 mol %, >0 to about 1 mol %, about 1 to about 8 mol %, about 1 to about 7 mol %, about 1 to about 6 mol %, about 1 to about 5 mol %, about 1 to about 4 mol %, about 1 to about 3 mol %, about 1 to about 2 mol %, about 2 to about 8 mol %, about 2 to about 7 mol %, about 2 to about 6 mol %, about 2 to about 5 mol %, about 2 to about 4 mol %, about 2 to about 3 mol %, about 3 to about 8 mol %, about 3 to about 7 mol %, about 3 to about 6 mol %, about 3 to about 5 mol %, about 3 to about 4 mol %, about 4 to about 8 mol %, about 4 to about 7 mol %, about 4 to about 6 mol %, about 4 to about 5 mol %, about 5 to about 8 mol %, about 5 to about 7 mol %, about 5 to about 6 mol %, about 6 to about 8 mol %, about 6 to about 7 mol %, or about 7 to about 8 mol % $K_2O$. In some embodiments, the glass compositions can comprise about 0, 1, 2, 3, 4, 5, 6, 7, or 8 mol % $K_2O$ In certain embodiments, the glass satisfies one or more of the following expressions:

$$1.0 \leq (M_2O+RO)/Al_2O_3 \leq 2; \text{ and}$$

$$0.4 \leq CaO/(CaO+SrO) \leq 1.$$

The ratio $(M_2O+RO)/Al_2O_3$ is advantageously greater than 1.0 to assist in removing bubbles from the glass during the initial melt step. This occurs because the alkali and alkaline earth metal oxides that are not involved in stabilizing $Al_2O_3$ are available to digest the silica source, typically a commercial sand. Surface area that might be sites for bubble nucleation and growth are therefore eliminated early in melting, and a comparatively bubble-free glass is obtained.

The glasses, according to some embodiments, can further comprise a variety of other components. For example, the glasses can comprise $SnO_2$, $Fe_2O_3$, MnO, $CeO_2$, $As_2O_3$, $Sb_2O_3$, Cl, Br, or combinations thereof. These materials can be added as fining agents (e.g., to facilitate removal of gaseous inclusions from melted batch materials used to produce the glass) and/or for other purposes. In certain embodiments, the glasses comprise $SnO_2$ (e.g., as calculated in mole percent on an oxide basis, 0.02 to 0.3 $SnO_2$, etc.) and $Fe_2O_3$ (e.g., as calculated in mole percent on an oxide basis, 0.005 to 0.08 $Fe_2O_3$, 0.01 to 0.08 $Fe_2O_3$, etc.). By way of illustration, in certain embodiments, the glasses comprise $SnO_2$ and $Fe_2O_3$, wherein, in mole percent on an oxide basis:

$$0.02 \leq SnO_2 \leq 0.3; \text{ and}$$

$$0.005 \leq Fe_2O_3 \leq 0.08.$$

In certain embodiments, the glasses comprise less than 0.05% mole percent of $Sb_2O_3$, $As_2O_3$, or combinations thereof. In certain embodiments, the glasses comprise $SnO_2$, $Fe_2O_3$, $CeO_2$, Cl, Br, or combinations thereof and include less than 0.05% (e.g., less than 0.04%, less than 0.03%, less than 0.02%, less than 0.01%, etc.) mole percent of $Sb_2O_3$, $As_2O_3$, or combinations thereof. In certain embodiments, the glasses comprise $SnO_2$ and $Fe_2O_3$ and include less than 0.05 mole percent (e.g., less than 0.04 mole percent, less than 0.03 mole percent, less than 0.02 mole percent, less than 0.01 mole percent, etc.) of $Sb_2O_3$, $As_2O_3$, or combinations thereof. In certain embodiments, the glasses comprise $SnO_2$ and $Fe_2O_3$, wherein, in mole percent on an oxide basis:

$$0.02 \leq SnO_2 \leq 0.3; \text{ and}$$

$$0.005 \leq Fe_2O_3 \leq 0.08,$$

and include less than 0.05% mole percent of $Sb_2O_3$, $As_2O_3$, or combinations thereof.

The glasses, according to some embodiments, (e.g., any of the glasses discussed above) can include F, Cl, or Br, for example, as in the case where the glasses comprise Cl and/or Br as fining agents. For example, the glass can comprise fluorine, chlorine, and/or bromine, wherein, as calculated in mole percent: $F+Cl+Br \leq 0.4$, such as where $F+Cl+Br \leq 0.3$, $F+Cl+Br \leq 0.2$, $F+Cl+Br \leq 0.1$, $0.001 \leq F+Cl+Br \leq 0.4$, and/or $0.005 \leq F+Cl+Br \leq 0.4$. By way of illustration, in certain embodiments, the glass comprises $SnO_2$ and $Fe_2O_3$ and, optionally, fluorine, chlorine, and/or bromine, such that, as calculated in mole percent on an oxide basis: $0.02 \leq SnO_2 \leq 0.3$, $0.005 \leq Fe_2O_3 \leq 0.08$, and $F+Cl+Br \leq 0.4$; and, in certain embodiments, the glass comprises $SnO_2$ and $Fe_2O_3$ and, optionally, $Sb_2O_3$, $As_2O_3$, fluorine, chlorine, and/or bromine, such that, as calculated in mole percent on an oxide basis, $0.02 \leq SnO_2 \leq 0.3$, $0.005 \leq Fe_2O_3 \leq 0.08$, and $F+Cl+Br \leq 0.4$, and such that the glass includes less than 0.05 mole percent (e.g., less than 0.04, less than 0.03, less than 0.02, less than 0.01, etc.) mole percent of $Sb_2O_3$, $As_2O_3$, or combinations thereof.

In some embodiments, the glass is substantially free of $Sb_2O_3$, $As_2O_3$, or combinations thereof, for example, the glass comprises 0.05 mole percent or less of $Sb_2O_3$ or $As_2O_3$ or a combination thereof. For example, the glass can comprise zero mole percent of $Sb_2O_3$ or $As_2O_3$ or a combination thereof.

The glass can further comprise 2 mole percent or less of $TiO_2$, MnO, ZnO, $Nb_2O_5$, $MoO_3$, $Ta_2O_5$, $WO_3$, $ZrO_2$, $Y_2O_3$, $La_2O_3$, $HfO_2$, CdO, $SnO_2$, $Fe_2O_3$, $CeO_2$, $As_2O_3$, $Sb_2O_3$, Cl, Br, $P_2O_5$, or combinations thereof.

The glasses, according to some embodiments, can further include contaminants as typically found in commercially prepared glass. In addition or alternatively, a variety of other oxides (e.g., $TiO_2$, MnO, ZnO, $Nb_2O_5$, $MoO_3$, $Ta_2O_5$, $WO_3$, $ZrO_2$, $Y_2O_3$, $La_2O_3$, $P_2O_5$, and the like) can be added, albeit with adjustments to other glass components, without compromising their melting or forming characteristics. In those cases where the glasses, according to some embodiments, further include such other oxide(s), each of such other oxides are typically present in an amount not exceeding 2 mole percent, and their total combined concentration is typically less than or equal to 5 mole percent, although higher amounts can be used so long as the amounts used do not place the composition outside of the ranges described above. The glasses, according to some embodiments, can also include various contaminants associated with batch materials and/or introduced into the glass by the melting, fining, and/or forming equipment used to produce the glass (e.g., $ZrO_2$).

The glass, according to some embodiments, is down-drawable; that is, the glass is capable of being formed into sheets using down-draw methods such as, but not limited to, fusion draw and slot draw methods that are known to those skilled in the glass fabrication arts. Such down-draw processes are used in the large-scale manufacture of flat glass, for example, display glass or ion-exchangeable glass.

The fusion draw process uses an isopipe that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the isopipe. These outside surfaces extend down and inwardly so that they join at an edge below the drawing tank. The two flowing glass surfaces join at this edge to fuse and form a single flowing sheet. The fusion draw method offers the advantage that, since the two glass films flowing over the channel fuse together, neither outside surface of the resulting glass sheet comes in contact with any part of the apparatus. Thus, the surface properties are not affected by such contact.

The slot draw method is distinct from the fusion draw method. Here the molten raw material glass is provided to a conduit. The bottom of the conduit has an open slot that is wider in one dimension than the other dimension with a nozzle that extends the length of the slot. The molten glass flows through the slot/nozzle and is drawn downward as a continuous sheet there through and into an annealing region. Compared to the fusion draw process, the slot draw process provides a thinner sheet, as only a single sheet is drawn through the slot, rather than two sheets being fused together, as in the fusion down-draw process.

In order to be compatible with down-draw processes, the aluminoborosilicate glass described herein has a high liquidus viscosity. In one embodiment, the glass has a liquidus viscosity of 50,000 poise or greater, for example, 150,000 poise or greater, for example, greater than or equal to 500,000 poise. The liquidus viscosities of the glasses are very closely correlated with the difference between the liquidus temperature and the softening point. This correlation is indicated by line 10 in FIG. 1. For down draw processes, the glasses preferably have liquidus—softening point less than about 230° C., more preferably less than 200° C.

Alternatively, the glass, may be formed by other processes, such as rolling, float, etc.

According to one embodiment, the glass is ion exchanged in a salt bath comprising one or more salts of alkali ions. The glass can be ion exchanged to change its mechanical properties. For example, smaller alkali ions, such as lithium or sodium, can be ion-exchanged in a molten salt containing one or more larger alkali ions, such as sodium, potassium, rubidium or cesium. If performed at a temperature well below the strain point for sufficient time, a diffusion profile will form in which the larger alkali moves into the glass surface from the salt bath, and the smaller ion is moved from the interior of the glass into the salt bath. When the sample is removed, the surface will go under compression, producing enhanced toughness against damage. Such toughness may be desirable in instances where the glass will be exposed to adverse environmental conditions, such as photovoltaic grids exposed to hail. A large alkali already in the glass can also be exchanged for a smaller alkali in a salt bath. If this is performed at temperatures close to the strain point, and if the glass is removed and its surface rapidly reheated to high temperature and rapidly cooled, the surface of the glass will show considerable compressive stress introduced by thermal tempering. This will also provide protection against adverse environmental conditions. It will be clear to one skilled in the art that any monovalent cation can be exchanged for alkalis already in the glass, including copper, silver, thallium, etc., and these also provide attributes of potential value to end uses, such as introducing color for lighting or a layer of elevated refractive index for light trapping.

In one embodiment, the glass is in the form of a sheet. The glass in the form of a sheet can be thermally tempered.

Another aspect comprises a photovoltaic thin-film solar device comprising the glass compositions described above as the starting super/substrate. In the case of CdTe-based modules, the design typically comprises the glass substrate, a transparent conductive oxide ("TCO") such at fluorine doped tin oxide ("FTO") or cadmium stannate ("CTO"), followed by resistive transparent layer such as tin oxide ("$SnO_2$") or zinc doped tin oxide ("ZTO"). Next to the resistive transparent layer is a n-type semiconductor such as CdS followed by a p-type semiconductor, such as CdTe.

In one embodiment, a photovoltaic device comprises the glass in the form of a sheet. The photovoltaic device can comprise more than one of the glass sheets, for example, as a substrate and/or as a superstrate. In one embodiment, the glass sheet is substantially planar. According to one embodiment, the glass sheet is transparent.

According to some embodiments, the glass sheet has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass sheet can have a thickness of any numerical value including decimal places in the range of from 0.1 mm up to and including 4.0 mm.

In another embodiment, the photovoltaic device comprising a glass sheet and an active photovoltaic medium adjacent to the glass sheet.

In one embodiment, the active photovoltaic medium comprises cadmium telluride.

Figure 2:
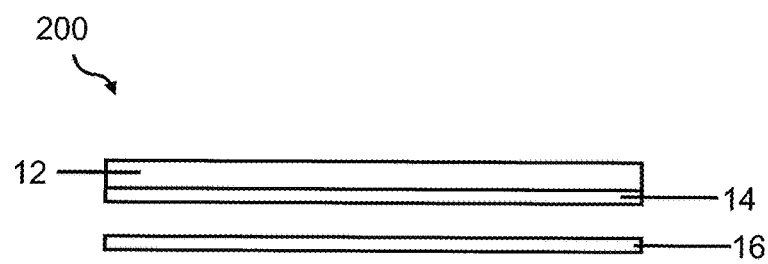
FIG. 2 is an illustration of features of a photovoltaic device according to one embodiment.

Another embodiment, as shown in FIG. 2 features 200 of a photovoltaic device comprising a glass sheet 12 comprising any of the glass compositions previously described and an active photovoltaic medium 16 adjacent to the glass sheet, wherein the active photovoltaic medium comprises cadmium telluride. According to one embodiment, the glass sheet has a thickness as previously described. The photovoltaic device can further comprise a conductive layer 14, such as a transparent conductive oxide adjacent to or disposed on the glass sheet.

EXAMPLES

Example 1

The following is an example of how to fabricate a sample of an exemplary glass, according to one embodiment of the invention, as shown in Table 1. This composition corresponds to composition number 46 shown in Table 7.

TABLE 1

| Oxide | mol % |
|---|---|
| $SiO_2$ | 63.5 |
| $Al_2O_3$ | 10.7 |
| $B_2O_3$ | 10.3 |
| $K_2O$ | 2.3 |
| MgO | 4.4 |
| CaO | 5.2 |
| SrO | 3.5 |
| $SnO_2$ | 0.1 |

In some embodiments, the total does not add up to 100%, since certain tramp elements are present at non-negligible concentrations.

Batch materials, as shown in Table 2 were weighed and added to a 4 liter plastic container:

TABLE 2

| Batch Components | Batch weight |
|---|---|
| sand | 1713.42 |
| alumina | 486.27 |
| boric acid | 570.42 |
| Potassium carbonate | 143.05 |

TABLE 2-continued

| Batch Components | Batch weight |
|---|---|
| Magnesia | 78.62 |
| Limestone | 240.73 |
| Strontium carbonate | 234.23 |
| 10% $SnO_2$ and 90% sand | 6.92 |

It should be appreciated that in the batch, limestone, depending on the source can contain tramp elements and/or vary amounts of one or more oxides, for example, MgO and/or BaO. The sand is advantageously beneficiated so that at least 80% by mass passes 60 mesh, for example 80 mesh, for example 100 mesh. The $SnO_2$ added, in this example, was pre-mixed with sand at a level of 10% by weight so as to ensure homogeneous mixing with the other components. The bottle containing the batch materials was mounted to a tumbler and the batch materials were mixed so as to make a homogeneous batch and to break up soft agglomerates. The mixed batch was transferred to a 1800 cc platinum crucible and placed into a high-temperature ceramic backer. The platinum in its backer was loaded into a glo-bar furnace idling at a temperature of 1550° C. After 6 hours, the crucible+backer was removed and the glass melt was poured onto a cold surface, such as a steel plate, to form a patty, and then transferred to an annealer held at a temperature of 670° C. The glass patty was held at the annealer temperature for 2 hours, then cooled at a rate of 1° C. per minute to room temperature.

Tables 3-13 show exemplary glasses, according to embodiments of the invention, and made according to the above example. Properties data for some glasses are also shown in Tables 3-13.

In view of its low liquidus temperature of 940° C. and, hence, its extremely high liquidus viscosity in excess of 5,000,000 poise, glass 49, shown in Table 8 is an advantageous glass for applications, such as glass for photovoltaics. The exemplary glasses shown in Table 8 comprise, in mole percent:

62 to 64 percent $SiO_2$;
8 to 12 percent $Al_2O_3$;
9 to 15 percent $B_2O_3$;
greater than 0 to 4 percent $M_2O$; and
12 to 15 percent RO;
wherein, M is an alkali metal and wherein, R is an alkaline earth metal.

Further, the glasses shown in Table 8 have anneal points ≥640° C., thermal expansion coefficients (CTE) of 40-50×10$^{-7}$/° C., 200 poise temperatures of ≤1550° C., and liquidus viscosities of ≥500,000 poise. Liquidus viscosity may be dependent on the $K_2O$ content, for example, exemplary glass 49 has a maximum value in excess of 5,000,000 poise for an intermediate $K_2O$ content when compared to exemplary glasses 48, 50, and 51.

TABLE 3

| | Glass | 1 | 2 | 3 | 4 | 5 |
|---|---|---|---|---|---|---|
| Weight Percent | $SiO_2$ | 58.11 | 59.14 | 59.01 | 58.88 | 58.35 |
| | $Al_2O_3$ | 17.76 | 18.07 | 18.03 | 17.99 | 17.82 |
| | $B_2O_3$ | 9.79 | 9.96 | 9.94 | 9.92 | 9.82 |
| | MgO | 3.26 | 4.45 | 3.88 | 3.31 | 3.27 |
| | CaO | 4.03 | 4.10 | 4.87 | 5.64 | 4.04 |
| | SrO | 2.85 | 0 | 0 | 0 | 0 |
| | BaO | 0 | 0 | 0 | 0 | 0 |
| | $Na_2O$ | 3.98 | 4.05 | 4.04 | 4.03 | 3.99 |
| | $K_2O$ | 0 | 0 | 0 | 0 | 2.60 |

TABLE 3-continued

|  |  |  |  |  |  |
|---|---|---|---|---|---|
|  | SnO₂ | 0.23 | 0.23 | 0.23 | 0.23 | 0.12 |
|  | Fe₂O₃ | 0 | 0 | 0 | 0 | 0 |
|  | total | 100.01 | 100 | 100 | 100 | 100.01 |
| Mole Percent | SiO₂ | 63.3 | 63.3 | 63.3 | 63.3 | 63.35 |
|  | Al₂O₃ | 11.4 | 11.4 | 11.4 | 11.4 | 11.4 |
|  | B₂O₃ | 9.2 | 9.2 | 9.2 | 9.2 | 9.2 |
|  | MgO | 5.3 | 7.1 | 6.2 | 5.3 | 5.3 |
|  | CaO | 4.7 | 4.7 | 5.6 | 6.5 | 4.7 |
|  | SrO | 1.8 | 0 | 0 | 0 | 0 |
|  | BaO | 0 | 0 | 0 | 0 | 0 |
|  | Na₂O | 4.2 | 4.2 | 4.2 | 4.2 | 4.2 |
|  | K₂O | 0 | 0 | 0 | 0 | 1.8 |
|  | SnO₂ | 0.1 | 0.1 | 0.1 | 0.1 | 0.05 |
|  | Fe₂O₃ | 0 | 0 | 0 | 0 | 0 |
|  | total | 100 | 100 | 100 | 100 | 100 |
| Properties | strain | 593 | 598 | 606 | 597 | 588 |
|  | anneal | 642 | 647 | 656 | 646 | 638 |
|  | softening point | 867 | 868 | 882 | 874 | 881 |
|  | CTE | 44.9 | 44 | 43.5 | 46.4 | 50.1 |
|  | density | 2.447 | 2.332 | 2.414 | 2.422 | 2.393 |
| Viscosity | A |  |  |  | −2.2233 | −2.5584 |
|  | B |  |  |  | 5556.58 | 6588.87 |
|  | To |  |  |  | 305.47 | 220.27 |
|  | T @ 200 p |  |  |  | 1533.625 | 1576.164 |
|  | T @ 35 kP |  |  |  | 1126.554 | 1147.957 |
|  | T @ 250 kP |  |  |  | 1034.561 | 1048.398 |
|  | T(200 P) − T(35 kP) |  |  |  | 407.071 | 428.206 |
| Resistivity | A |  |  |  | 3.0838 | 3.9616 |
|  | B |  |  |  | 1183.49 | 4266.54 |
|  | To |  |  |  | 2156.83 | 3061.95 |
|  | R @ 200 p |  |  |  | 15.30245 | 12.30353 |
| Liquidus | air | 1070 | 1090 | 1065 | 1060 | 995 |
|  | internal | 1060 | 1080 | 1060 | 1050 | 980 |
|  | Pt | 1040 | 1050 | 1030 | 1040 | 975 |
|  | phase | Albite | Albite | Albite | Albite | Albite |
|  | Liquidus viscosity |  |  |  | 173742.1 | 1300909 |
|  | Int liq − soft | 193 | 212 | 178 | 176 | 99 |
|  | estimated liquidus viscosity | 107951.5 | 64408.99 | 168454.9 | 179256.1 | 4244242 |

|  | Glass | 6 | 7 | 8 | 9 |
|---|---|---|---|---|---|
| Weight Percent | SiO₂ | 58.40 | 58.54 | 58.74 | 58.56 |
|  | Al₂O₃ | 17.83 | 17.88 | 17.94 | 17.88 |
|  | B₂O₃ | 9.83 | 9.85 | 9.88 | 9.85 |
|  | MgO | 3.28 | 3.91 | 4.54 | 3.62 |
|  | CaO | 4.90 | 4.05 | 4.07 | 4.46 |
|  | SrO | 0 | 0 | 0 | 0 |
|  | BaO | 0 | 0 | 0 | 0 |
|  | Na₂O | 3.04 | 3.05 | 2.10 | 3.34 |
|  | K₂O | 2.60 | 2.61 | 2.62 | 2.17 |
|  | SnO₂ | 0.12 | 0.12 | 0.12 | 0.12 |
|  | Fe₂O₃ | 0 | 0 | 0 | 0 |
|  | total | 100 | 100.01 | 100.01 | 100 |
| Mole Percent | SiO₂ | 63.35 | 63.35 | 63.35 | 63.35 |
|  | Al₂O₃ | 11.4 | 11.4 | 11.4 | 11.4 |
|  | B₂O₃ | 9.2 | 9.2 | 9.2 | 9.2 |
|  | MgO | 5.3 | 6.3 | 7.3 | 5.83 |
|  | CaO | 5.7 | 4.7 | 4.7 | 5.17 |
|  | SrO | 0 | 0 | 0 | 0 |
|  | BaO | 0 | 0 | 0 | 0 |
|  | Na₂O | 3.2 | 3.2 | 2.2 | 3.5 |
|  | K₂O | 1.8 | 1.8 | 1.8 | 1.5 |
|  | SnO₂ | 0.05 | 0.05 | 0.05 | 0.05 |
|  | Fe₂O₃ | 0 | 0 | 0 | 0 |
|  | total | 100 | 100 | 100 | 100 |
| Properties | strain | 592 | 601 | 613 | 594 |
|  | anneal | 643 | 652 | 663 | 646 |
|  | softening point | 885 | 890 | 901 | 883 |
|  | CTE | 47.8 | 47 | 43.7 | 47.2 |
|  | density | 2.402 | 2.401 | 2.399 | 2.401 |

TABLE 3-continued

|  |  |  |  |  |  |
|---|---|---|---|---|---|
| Viscosity | A |  |  |  |  |
|  | B |  |  |  |  |
|  | To |  |  |  |  |
|  | T @ 200 p |  |  |  |  |
|  | T @ 35 kP |  |  |  |  |
|  | T @ 250 kP |  |  |  |  |
|  | T(200 P) − T(35 kP) |  |  |  |  |
| Resistivity | A |  |  |  |  |
|  | B |  |  |  |  |
|  | To |  |  |  |  |
|  | R @ 200 p |  |  |  |  |
| Liquidus | air | 1050 | 1040 | 1115 | 1030 |
|  | internal | 1040 | 1030 | 1105 | 1020 |
|  | Pt | 1020 | 1015 | 1075 | 1000 |
|  | phase | Albite | Albite | Albite | Albite |
|  | Liquidus viscosity |  |  |  |  |
|  | Int liq - soft | 155 | 140 | 204 | 137 |
|  | estimated liquidus viscosity | 360553.2 | 631087.4 | 79584.37 | 710936.1 |

TABLE 4

|  | Glass | 10 | 11 | 12 | 13 | 14 |
|---|---|---|---|---|---|---|
| Weight Percent | $SiO_2$ | 58.78 | 57.16 | 57.49 | 57.83 | 58.17 |
|  | $Al_2O_3$ | 17.95 | 17.46 | 17.56 | 17.66 | 17.76 |
|  | $B_2O_3$ | 9.89 | 9.62 | 9.67 | 9.73 | 9.79 |
|  | MgO | 3.96 | 3.21 | 3.48 | 3.76 | 4.04 |
|  | CaO | 4.88 | 3.96 | 4.34 | 4.72 | 5.11 |
|  | SrO | 0 | 0 | 0 | 0 | 0 |
|  | BaO | 0 | 0 | 0 | 0 | 0 |
|  | $Na_2O$ | 2.68 | 0 | 0 | 0 | 0 |
|  | $K_2O$ | 1.75 | 8.49 | 7.34 | 6.18 | 5.01 |
|  | $SnO_2$ | 0.12 | 0.11 | 0.11 | 0.11 | 0.12 |
|  | $Fe_2O_3$ | 0 | 0 | 0 | 0 | 0 |
|  | total | 100.01 | 100.01 | 99.99 | 99.99 | 100 |
| Mole Percent | $SiO_2$ | 63.35 | 63.35 | 63.35 | 63.35 | 63.35 |
|  | $Al_2O_3$ | 11.40 | 11.40 | 11.40 | 11.40 | 11.40 |
|  | $B_2O_3$ | 9.20 | 9.20 | 9.20 | 9.20 | 9.20 |
|  | MgO | 6.36 | 5.30 | 5.72 | 6.14 | 6.56 |
|  | CaO | 5.64 | 4.70 | 5.12 | 5.54 | 5.96 |
|  | SrO | 0 | 0 | 0 | 0 | 0 |
|  | BaO | 0 | 0 | 0 | 0 | 0 |
|  | $Na_2O$ | 2.80 | 0 | 0 | 0 | 0 |
|  | $K_2O$ | 1.20 | 6.00 | 5.16 | 4.32 | 3.48 |
|  | $SnO_2$ | 0.05 | 0.05 | 0.05 | 0.05 | 0.05 |
|  | $Fe_2O_3$ | 0 | 0 | 0 | 0 | 0 |
|  | total | 100 | 100 | 100 | 100 | 100 |
| Properties | strain | 604 | 608 | 621 | 624 | 632 |
|  | anneal | 655 | 661 | 674 | 675 | 685 |
|  | softening point | 885 | 914 | 911 | 916 | 925 |
|  | CTE | 44.5 | 52.1 | 48.9 | 45.6 | 44.1 |
|  | density | 2.411 | 2.382 | 2.389 | 2.393 | 2.397 |
| Viscosity | A |  |  |  | −2.7798 | −2.7896 |
|  | B |  |  |  | 6788.52 | 6506.53 |
|  | To |  |  |  | 263.53 | 291.74 |
|  | T @ 200 p |  |  |  | 1599.635 | 1569.878 |
|  | T @ 35 kP |  |  |  | 1190.434 | 1178.954 |
|  | T @ 250 kP |  |  |  | 1093.652 | 1086.427 |
|  | T(200 P) − T(35 kP) |  |  |  | 409.2009 | 390.9249 |
| Resistivity | A |  |  |  | −2.6974 | −3.1433 |
|  | B |  |  |  | 7362.61 | 7835.22 |
|  | To |  |  |  | −175.21 | −98.68 |
|  | R @ 200 p |  |  |  | 28.24312 | 35.68633 |
| Liquidus | air | 1040 | 990 | 980 | 1030 | 1070 |
|  | internal | 1030 | 980 | 970 | 1015 | 1065 |
|  | Pt | 1005 | 965 | 960 | 1000 | 1050 |
|  | phase | Albite | Orthoclase | Orthoclase | Cordierite | Cordierite |
|  | Liquidus viscosity |  |  |  | 1794130.5 | 421516.23 |
|  | Int liq - soft | 145 | 66 | 59 | 99 | 140 |
|  | estimated liquidus viscosity | 520319.01 | 39473174.9 | 73132031.9 | 4244242 | 631087.4 |

TABLE 4-continued

| | Glass | 15 | 16 | 17 | 18 | 19 |
|---|---|---|---|---|---|---|
| Weight Percent | $SiO_2$ | 58.52 | 58.87 | 58.17 | 58.33 | 58.51 |
| | $Al_2O_3$ | 17.87 | 17.98 | 17.76 | 17.81 | 17.87 |
| | $B_2O_3$ | 9.85 | 9.91 | 9.79 | 9.82 | 9.84 |
| | MgO | 4.33 | 4.61 | 4.04 | 4.05 | 4.06 |
| | CaO | 5.50 | 5.90 | 5.11 | 5.54 | 5.99 |
| | SrO | 0 | 0 | 0 | 0 | 0 |
| | BaO | 0 | 0 | 0 | 0 | 0 |
| | $Na_2O$ | 0 | 0 | 0 | 0 | 0 |
| | $K_2O$ | 3.82 | 2.62 | 5.01 | 4.33 | 3.62 |
| | $SnO_2$ | 0.12 | 0.12 | 0.12 | 0.12 | 0.12 |
| | $Fe_2O_3$ | 0 | 0 | 0 | 0 | 0 |
| | total | 100.01 | 100.01 | 100 | 100 | 100.01 |
| Mole Percent | $SiO_2$ | 63.35 | 63.35 | 63.35 | 63.35 | 63.35 |
| | $Al_2O_3$ | 11.40 | 11.40 | 11.40 | 11.40 | 11.40 |
| | $B_2O_3$ | 9.20 | 9.20 | 9.20 | 9.20 | 9.20 |
| | MgO | 6.98 | 7.40 | 6.56 | 6.55 | 6.55 |
| | CaO | 6.38 | 6.80 | 5.96 | 6.45 | 6.95 |
| | SrO | 0 | 0 | 0 | 0 | 0 |
| | BaO | 0 | 0 | 0 | 0 | 0 |
| | $Na_2O$ | 0 | 0 | 0 | 0 | 0 |
| | $K_2O$ | 2.64 | 1.80 | 3.48 | 3.00 | 2.50 |
| | $SnO_2$ | 0.05 | 0.05 | 0.05 | 0.05 | 0.05 |
| | $Fe_2O_3$ | 0 | 0 | 0 | 0 | 0 |
| | total | 100 | 100 | 100 | 100 | 100 |
| Properties | strain | 631 | 639 | 630 | 630 | 635 |
| | anneal | 683 | 689 | 683 | 682 | 687 |
| | softening point | 914 | 913 | 921 | 918 | 922 |
| | CTE | 41.5 | 39.6 | 43.3 | 41.6 | 40.4 |
| | density | 2.412 | 2.43 | 2.4 | 2.404 | 2.408 |
| Viscosity | A | | | | | |
| | B | | | | | |
| | To | | | | | |
| | T @ 200 p | | | | | |
| | T @ 35 kP | | | | | |
| | T @ 250 kP | | | | | |
| | T(200 P) − T(35 kP) | | | | | |
| Resistivity | A | | | | | |
| | B | | | | | |
| | To | | | | | |
| | R @ 200 p | | | | | |
| Liquidus | air | 1110 | 1135 | 1085 | 1070 | 1075 |
| | internal | 1100 | 1125 | 1070 | 1065 | 1060 |
| | Pt | 1080 | 1105 | 1060 | 1050 | 1045 |
| | phase | Cordierite | Cordierite | Cordierite | Cordierite | Cordierite |
| | Liquidus viscosity | | | | | |
| | Int liq − soft | 186 | 212 | 149 | 147 | 138 |
| | estimated liquidus viscosity | 132273.398 | 64408.987 | 447990.94 | 482556.71 | 683059.804 |

TABLE 5

| | Glass | 20 | 21 | 22 | 23 | 24 |
|---|---|---|---|---|---|---|
| Weight Percent | $SiO_2$ | 57.49 | 57.65 | 57.82 | 58.47 | 57.78 |
| | $Al_2O_3$ | 17.55 | 17.6 | 17.65 | 17.86 | 17.64 |
| | $B_2O_3$ | 10.85 | 10.88 | 10.91 | 9.84 | 10.9 |
| | MgO | 4 | 4 | 4.02 | 4.06 | 4.02 |
| | CaO | 5.04 | 5.48 | 5.92 | 5.99 | 5.92 |
| | SrO | 0 | 0 | 0 | 0 | 0 |
| | BaO | 0 | 0 | 0 | 0 | 0 |
| | $Na_2O$ | 0 | 0 | 0 | 0 | 0 |
| | $K_2O$ | 4.95 | 4.28 | 3.57 | 3.62 | 3.57 |
| | $SnO_2$ | 0.12 | 0.12 | 0.12 | 0.16 | 0.16 |
| | $Fe_2O_3$ | 0 | 0 | 0 | 0 | 0 |
| | total | 100 | 100.01 | 100.01 | 100 | 99.99 |
| Mole Percent | $SiO_2$ | 62.65 | 62.65 | 62.65 | 63.33 | 62.63 |
| | $Al_2O_3$ | 11.27 | 11.27 | 11.27 | 11.40 | 11.27 |
| | $B_2O_3$ | 10.20 | 10.20 | 10.20 | 9.20 | 10.20 |
| | MgO | 6.50 | 6.48 | 6.49 | 6.55 | 6.49 |
| | CaO | 5.89 | 6.38 | 6.87 | 6.95 | 6.87 |
| | SrO | 0 | 0 | 0 | 0 | 0 |
| | BaO | 0 | 0 | 0 | 0 | 0 |
| | $Na_2O$ | 0 | 0 | 0 | 0 | 0 |
| | $K_2O$ | 3.44 | 2.97 | 2.47 | 2.50 | 2.47 |

TABLE 5-continued

|  |  |  |  |  |  |  |
|---|---|---|---|---|---|---|
|  | $SnO_2$ | 0.05 | 0.05 | 0.05 | 0.07 | 0.07 |
|  | $Fe_2O_3$ |  |  |  |  |  |
|  | total | 100 | 100 | 100 | 100 | 100 |
| Properties | strain | 623 | 630 | 632 | 637 | 630 |
|  | anneal | 673 | 680 | 682 | 688 | 680 |
|  | softening point | 916 | 913 | 914 | 922 | 918 |
|  | CTE | 43.7 | 42.2 | 40.3 | 41.1 | 41 |
|  | density | 2.394 | 2.395 | 2.401 | 2.411 | 2.405 |
| Viscosity | A |  |  |  | −2.826 | −2.7517 |
|  | B |  |  |  | 6611.93 | 6318.79 |
|  | To |  |  |  | 284.22 | 304.73 |
|  | T @ 200 p |  |  |  | 1573.842 | 1555.299 |
|  | T @ 35 kP |  |  |  | 1181.353 | 1170.820 |
|  | T @ 250 kP |  |  |  | 1088.206 | 1080.076 |
|  | T(200 P) − T(35 kP) |  |  |  | 392.489 | 384.480 |
| Resistivity | A |  |  |  | −4.9927 | −2.6521 |
|  | B |  |  |  | 13663.94 | 5980.3 |
|  | To |  |  |  | −556.65 | 129.56 |
|  | R @ 200 p |  |  |  | 26.35204 | 34.86784 |
| Liquidus | air | 1040 | 1050 | 1065 | 1060 | 1040 |
|  | internal | 1035 | 1045 | 1050 | 1055 | 1030 |
|  | Pt | 1020 | 1025 | 1030 | 1040 | 1020 |
|  | phase | Cordierite | Cordierite | Cordierite | Cordierite | Cordierite |
|  | Liquidus viscosity |  |  |  | 565239.4 | 913330.2 |
|  | Int liq − soft | 119 | 132 | 136 | 133 | 112 |
|  | estimated liquidus viscosity | 1542714 | 872242.2 | 740167 | 836776.9 | 2153251 |

|  | Glass | 25 | 26 | 27 | 28 |
|---|---|---|---|---|---|
| Weight Percent | $SiO_2$ | 58.61 | 57.36 | 56.92 | 58.14 |
|  | $Al_2O_3$ | 17.27 | 17.51 | 17.39 | 17.03 |
|  | $B_2O_3$ | 9.86 | 10.82 | 10.74 | 10.45 |
|  | MgO | 4 | 3.98 | 3.96 | 3.85 |
|  | CaO | 6.3 | 6.61 | 7.31 | 5.67 |
|  | SrO | 0 | 0 | 0 | 0 |
|  | BaO | 0 | 0 | 0 | 0 |
|  | $Na_2O$ | 0 | 0 | 0 | 0 |
|  | $K_2O$ | 3.84 | 3.55 | 3.52 | 4.69 |
|  | $SnO_2$ | 0.12 | 0.16 | 0.16 | 0.16 |
|  | $Fe_2O_3$ | 0 | 0 | 0 | 0 |
|  | total | 100 | 99.99 | 100 | 99.99 |
| Mole Percent | $SiO_2$ | 63.35 | 62.10 | 61.55 | 63.15 |
|  | $Al_2O_3$ | 11.00 | 11.17 | 11.08 | 10.90 |
|  | $B_2O_3$ | 9.20 | 10.11 | 10.02 | 9.8 |
|  | MgO | 6.45 | 6.43 | 6.38 | 6.23 |
|  | CaO | 7.30 | 7.67 | 8.47 | 6.60 |
|  | SrO | 0 | 0 | 0 | 0 |
|  | BaO | 0 | 0 | 0 | 0 |
|  | $Na_2O$ | 0 | 0 | 0 | 0 |
|  | $K_2O$ | 2.65 | 2.45 | 2.43 | 3.25 |
|  | $SnO_2$ | 0.05 | 0.07 | 0.07 | 0.07 |
|  | $Fe_2O_3$ |  |  |  |  |
|  | total | 100 | 100 | 100 | 100 |
| Properties | strain | 633 | 628 | 630 | 624 |
|  | anneal | 683 | 677 | 677 | 674 |
|  | softening point | 918 | 907 | 901 | 911 |
|  | CTE | 41.9 | 42 | 43.2 | 44.1 |
|  | density | 2.412 | 2.414 | 2.424 | 2.404 |
| Viscosity | A | −2.6477 | −3.0308 | −2.8977 | −3.0702 |
|  | B | 6160.22 | 6642.81 | 6307 | 6906.16 |
|  | To | 314.38 | 271.68 | 291.74 | 253.21 |
|  | T @ 200 p | 1559.188 | 1517.558 | 1504.921 | 1538.979 |
|  | T @ 35 kP | 1170.945 | 1148.634 | 1139.254 | 1160.212 |
|  | T @ 250 kP | 1080.039 | 1059.794 | 1052.019 | 1068.756 |
|  | T(200 P) − T(35 kP) | 388.243 | 368.924 | 365.667 | 378.766 |
| Resistivity | A | −2.6628 | −2.9715 | −2.7071 | −3.4632 |
|  | B | 6172.99 | 6668.56 | 5845.08 | 8147.16 |
|  | To | 100.8 | 50.95 | 149.34 | −101.76 |
|  | R @ 200 p | 37.14907 | 37.62072 | 40.24979 | 31.79388 |
| Liquidus | air | 1065 | 1060 | 1025 | 1010 |
|  | internal | 1050 | 1050 | 1015 | 1000 |
|  | Pt | 1040 | 1030 | 1000 | 990 |
|  | phase | Anorthite | Anorthite | Anorthite | Anorthite |
|  | Liquidus viscosity | 532706.2 | 319158 | 664567.2 | 1505199 |
|  | Int liq − soft | 132 | 143 | 114 | 89 |
|  | estimated liquidus viscosity | 872242.2 | 561623.8 | 1953516 | 7623399 |

TABLE 6

| | Glass | 29 | 30 | 31 | 32 | 33 | 34 | 35 | 36 | 37 | 38 |
|---|---|---|---|---|---|---|---|---|---|---|---|
| Weight Percent | $SiO_2$ | 56.19 | 56.33 | 56.46 | 56.6 | 56.72 | 56.48 | 57.32 | 58.17 | 57.29 | 56.92 |
| | $Al_2O_3$ | 17.45 | 17.01 | 16.56 | 16.11 | 15.66 | 17.77 | 17.52 | 17.27 | 17.03 | 16.63 |
| | $B_2O_3$ | 11.27 | 10.63 | 9.98 | 9.33 | 8.68 | 11.17 | 9.70 | 8.21 | 9.26 | 9.38 |
| | MgO | 2.78 | 2.61 | 2.43 | 2.26 | 2.08 | 2.76 | 2.39 | 2.01 | 2.27 | 2.29 |
| | CaO | 4.62 | 4.36 | 4.10 | 3.84 | 3.58 | 4.57 | 3.94 | 3.31 | 3.77 | 3.84 |
| | SrO | 5.83 | 5.52 | 5.20 | 4.89 | 4.57 | 5.76 | 5.00 | 4.23 | 4.79 | 4.88 |
| | BaO | 0 | 0 | 0 | 0 | 0 | 0 | 0 | 0 | 0 | 0 |
| | $Na_2O$ | 1.68 | 3.37 | 5.06 | 6.77 | 8.48 | 1.30 | 3.92 | 6.56 | 5.39 | 5.86 |
| | $K_2O$ | 0 | 0 | 0 | 0 | 0 | 0 | 0 | 0 | 0 | 0 |
| | $SnO_2$ | 0.18 | 0.18 | 0.21 | 0.21 | 0.23 | 0.18 | 0.20 | 0.23 | 0.21 | 0.21 |
| | $Fe_2O_3$ | 0 | 0 | 0 | 0 | 0 | 0 | 0 | 0 | 0 | 0 |
| | total | 100 | 100.01 | 100 | 100.01 | 100 | 99.99 | 99.99 | 99.99 | 100.01 | 100.01 |
| Mole Percent | $SiO_2$ | 62.18 | 62.16 | 62.14 | 62.12 | 62.10 | 62.56 | 63.28 | 64.00 | 63.08 | 62.60 |
| | $Al_2O_3$ | 11.38 | 11.06 | 10.74 | 10.42 | 10.10 | 11.60 | 11.40 | 11.20 | 11.05 | 10.78 |
| | $B_2O_3$ | 10.76 | 10.12 | 9.48 | 8.84 | 8.20 | 10.68 | 9.24 | 7.80 | 8.80 | 8.90 |
| | MgO | 4.58 | 4.29 | 3.99 | 3.70 | 3.40 | 4.56 | 3.93 | 3.30 | 3.72 | 3.75 |
| | CaO | 5.48 | 5.16 | 4.84 | 4.52 | 4.20 | 5.42 | 4.66 | 3.90 | 4.45 | 4.52 |
| | SrO | 3.74 | 3.53 | 3.32 | 3.11 | 2.90 | 3.70 | 3.20 | 2.70 | 3.06 | 3.11 |
| | BaO | 0 | 0 | 0 | 0 | 0 | 0 | 0 | 0 | 0 | 0 |
| | $Na_2O$ | 1.80 | 3.60 | 5.40 | 7.20 | 9.00 | 1.40 | 4.20 | 7.00 | 5.75 | 6.25 |
| | $K_2O$ | 0 | 0 | 0 | 0 | 0 | 0 | 0 | 0 | 0 | 0 |
| | $SnO_2$ | 0.08 | 0.08 | 0.09 | 0.09 | 0.10 | 0.08 | 0.09 | 0.10 | 0.09 | 0.09 |
| | $Fe_2O_3$ | 0 | 0 | 0 | 0 | 0 | 0 | 0 | 0 | 0 | 0 |
| | total | 100 | 100 | 100 | 100 | 100 | 100 | 100 | 100 | 100 | 100 |
| Properties | strain | 611 | 590 | 578 | 565 | | 620 | 589 | 577 | 577 | 576 |
| | anneal | 659 | 636 | 622 | 607 | | 670 | 635 | 623 | 625 | 621 |
| | softening point | 887.1 | 856.5 | 831.1 | 807.2 | 780 | 899.5 | 866.3 | 850.5 | 843 | 836.1 |
| | CTE | 41.6 | 47.7 | 53.9 | 59.6 | | 40.4 | 48.1 | 56.6 | 52.8 | 55.4 |
| | density | 2.478 | 2.48 | 2.492 | 2.494 | 2.501 | 2.472 | 2.467 | 2.463 | 2.472 | 2.478 |
| Viscosity | A | −2.475 | −2.209 | −2.175 | −2.086 | −1.813 | | −2.817 | | −2.501 | −1.845 |
| | B | 5764.2 | 5523.2 | 5563.1 | 5506.2 | 4988.5 | | 6843.6 | | 6402.1 | 5180.5 |
| | To | 306 | 290.2 | 258.9 | 231 | 242.7 | | 193.3 | | 197.4 | 272 |
| | 200 | 1512.9 | 1514.85 | 1501.76 | 1486.11 | 1455.26 | | 1530.46 | | 1530.61 | 1521.51 |
| | 3000 | 1274.43 | 1261.55 | 1243.15 | 1220.77 | 1185.68 | | 1280.6 | | 1268.32 | 1245.39 |
| | 30000 | 1135.13 | 1116.27 | 1095.19 | 1069.96 | 1035.77 | | 1131.54 | | 1114.85 | 1091.42 |
| | 50000 | 1109.49 | 1089.74 | 1068.2 | 1042.53 | 1008.75 | | 1103.84 | | 1086.58 | 1063.64 |
| Liquidus | internal | 1010 | 1025 | 1040 | 1020 | 980 | 1030 | 1020 | 1070 | 1010 | 1040 |
| | Liquidus viscosity | 516159.7 | 203050.1 | 88539.17 | 78110.11 | 89722.76 | | | | 238527.3 | 79513.84 |
| | Int liq − soft | 122.9 | 168.5 | 208.9 | 212.8 | 200 | 130.5 | 153.7 | 219.5 | 167 | 203.9 |

TABLE 7

| | Glass | 39 | 40 | 41 | 42 | 43 | 44 | 45 | 46 | 47 |
|---|---|---|---|---|---|---|---|---|---|---|
| Weight Percent | $SiO_2$ | 56.76 | 57.00 | 57.33 | 57.72 | 58.11 | 59.01 | 56.88 | 57.06 | 57.30 |
| | $Al_2O_3$ | 17.19 | 16.95 | 17.52 | 17.64 | 17.76 | 15.66 | 17.09 | 16.32 | 17.52 |
| | $B_2O_3$ | 10.19 | 9.6 | 9.66 | 9.72 | 9.79 | 9.84 | 10.20 | 10.72 | 9.70 |
| | MgO | 2.50 | 2.35 | 2.37 | 2.81 | 3.26 | 2.45 | 2.56 | 2.65 | 2.39 |
| | CaO | 4.17 | 3.92 | 3.97 | 4.00 | 4.03 | 4.01 | 4.15 | 4.36 | 3.94 |
| | SrO | 5.24 | 4.98 | 5.00 | 3.93 | 2.85 | 5.04 | 5.16 | 5.42 | 5.00 |
| | BaO | 0 | 0 | 0 | 0 | 0 | 0 | 0 | 0 | 0 |
| | $Na_2O$ | 3.74 | 4.99 | 3.92 | 3.95 | 3.98 | 3.77 | 3.74 | 0 | 3.92 |
| | $K_2O$ | 0 | 0 | 0 | 0 | 0 | 0 | 0 | 3.24 | 0 |
| | $SnO_2$ | 0.20 | 0.20 | 0.23 | 0.23 | 0.23 | 0.23 | 0.23 | 0.23 | 0.23 |
| | $Fe_2O_3$ | 0 | 0 | 0 | 0 | 0 | 0 | 0 | 0 | 0 |
| | total | 99.99 | 99.99 | 100 | 100 | 100.01 | 100.01 | 100.01 | 100 | 100 |
| Mole Percent | $SiO_2$ | 62.63 | 62.78 | 63.3 | 63.3 | 63.30 | 64.6 | 62.7 | 63.50 | 63.28 |
| | $Al_2O_3$ | 11.18 | 11.00 | 11.40 | 11.40 | 11.40 | 10.10 | 11.10 | 10.70 | 11.40 |
| | $B_2O_3$ | 9.70 | 9.13 | 9.20 | 9.20 | 9.20 | 9.30 | 9.70 | 10.30 | 9.24 |
| | MgO | 4.12 | 3.86 | 3.90 | 4.60 | 5.30 | 4.00 | 4.20 | 4.40 | 3.93 |
| | CaO | 4.93 | 4.63 | 4.70 | 4.70 | 4.70 | 4.70 | 4.90 | 5.20 | 4.66 |
| | SrO | 3.35 | 3.18 | 3.20 | 2.50 | 1.80 | 3.20 | 3.30 | 3.50 | 3.20 |
| | BaO | 0 | 0 | 0 | 0 | 0 | 0 | 0 | 0 | 0 |
| | $Na_2O$ | 4.00 | 5.33 | 4.20 | 4.20 | 4.20 | 4.00 | 4.00 | 0.00 | 4.20 |
| | $K_2O$ | 0 | 0 | 0 | 0 | 0 | 0 | 0 | 2.3 | 0 |
| | $SnO_2$ | 0.09 | 0.09 | 0.10 | 0.10 | 0.10 | 0.10 | 0.10 | 0.10 | 0.10 |
| | $Fe_2O_3$ | 0 | 0 | 0 | 0 | 0 | 0 | 0 | 0 | 0 |
| | total | | | | | | | | | |

TABLE 7-continued

| | Glass | 39 | 40 | 41 | 42 | 43 | 44 | 45 | 46 | 47 |
|---|---|---|---|---|---|---|---|---|---|---|
| Properties | strain | 589 | 578 | 596 | 597 | 596 | 590 | 593 | 619 | 597 |
| | anneal | 638 | 626 | 643 | 644 | 645 | 637 | 640 | 669 | 645 |
| | softening point | 858.5 | 843.2 | 867.6 | 867 | 876.9 | 859.5 | 858.5 | 898 | 873 |
| | CTE | 48.4 | 51.7 | 48.1 | 47.3 | 46.1 | 47.6 | 48 | 44.2 | 47.2 |
| | density | 2.477 | 2.474 | 2.475 | 2.466 | 2.451 | 2.472 | 2.476 | 2.465 | 2.466 |
| Viscosity | A | −2.549 | −2.625 | | | | −2.625 | | −2.567 | |
| | B | 6218.5 | 6434.5 | | | | 6434.5 | | 6097.1 | |
| | To | 233.8 | 223.8 | | | | 223.8 | | 303.3 | |
| | 200 | 1515.96 | 1530.02 | | | | 1530.02 | | 1555.78 | |
| | 3000 | 1265.72 | 1278.27 | | | | 1278.27 | | 1312.07 | |
| | 30000 | 1118.85 | 1129.8 | | | | 1129.8 | | 1168.86 | |
| | 50000 | 1091.76 | 1102.35 | | | | 1102.35 | | 1142.43 | |
| Liquidus | internal | 1045 | 1040 | 1095 | 1080 | 1060 | 1015 | 1060 | 1050 | 1065 |
| | Liquidus viscosity | 130859 | 181336.2 | | | | 321798.1 | | 396638.1 | |
| | Int liq − soft | 186.5 | 196.8 | 227.4 | 213 | 183.1 | 155.5 | 201.5 | 152 | 192 |

TABLE 8

| | Glass | 48 | 49 | 50 | 51 |
|---|---|---|---|---|---|
| Mole Percent | $SiO_2$ | 63 | 62.95 | 62.9 | 62.85 |
| | $Al_2O_3$ | 11 | 10.3 | 9.65 | 9 |
| | $B_2O_3$ | 10.2 | 11.6 | 13.05 | 14.5 |
| | MgO | 5.5 | 4.13 | 2.75 | 1.38 |
| | CaO | 6.1 | 4.6 | 3.05 | 1.53 |
| | SrO | 1.8 | 1.43 | 1.05 | 1.68 |
| | BaO | 0 | 3.1 | 6.15 | 9.22 |
| | $K_2O$ | 2.4 | 1.8 | 1.2 | 0.6 |
| | $SnO_2$ | 0.1 | 0.1 | 0.1 | 0.1 |
| Weight Percent | $SiO_2$ | 57.2 | 54.9 | 52.9 | 51 |
| | $Al_2O_3$ | 16.9 | 15.3 | 13.8 | 12.4 |
| | $B_2O_3$ | 10.7 | 11.7 | 12.7 | 13.6 |
| | MgO | 3.34 | 2.42 | 1.55 | 0.75 |
| | CaO | 5.17 | 3.74 | 2.4 | 1.16 |
| | SrO | 2.81 | 2.16 | 1.53 | 0.95 |
| | BaO | 0 | 6.91 | 13.2 | 19.1 |
| | $K_2O$ | 3.41 | 2.47 | 1.58 | 0.76 |
| | $SnO_2$ | 0.23 | 0.22 | 0.21 | 0.2 |
| Properties | strain | 628 | 609 | 603 | 598 |
| | anneal | 678 | 659 | 651 | 644 |
| | softening | 909 | 890 | 876 | 858 |
| | CTE | 42.8 | 43.9 | 45.4 | 46 |
| | Density | 2.44 | 2.516 | 2.606 | 2.677 |
| Viscosity | 200 | 1529 | 1525 | 1528 | |
| | Internal Liquidus | 1020 | 940 | 980 | 980 |
| | Liquidus Viscosity | 822,000 | 5,233,000 | 1,100,000 | |

TABLE 9

| | Example | | | | | | | |
|---|---|---|---|---|---|---|---|---|
| Mol % | 52 | 53 | 54 | 55 | 56 | 57 | 58 | 59 |
| MgO | 2.1 | 2.1 | 2 | 2 | 2.2 | | 2.35 | 1.9 |
| CaO | 21.2 | 20.6 | 20.1 | 19.85 | 21.65 | 13.2 | 25.6 | 20.8 |
| SrO | | | | | | 8.7 | | |
| BaO | 2.1 | 2.1 | 2 | 2 | 2.2 | | 2.35 | 1.9 |
| RO | 25.4 | 24.8 | 24.1 | 23.85 | 26.05 | 21.9 | 30.3 | 24.6 |
| $B_2O_3$ | 2.5 | 5 | 7.5 | | | 8 | | |
| $Al_2O_3$ | 8.8 | 8.6 | 8.4 | 8.25 | 6.05 | 10.1 | 11.7 | 9.4 |
| $SiO_2$ | 63.2 | 61.5 | 59.9 | 67.8 | 67.8 | 59.9 | 57.9 | 65.9 |
| $SnO_2$ | 0.1 | 0.1 | 0.1 | 0.1 | 0.1 | 0.1 | 0.1 | 0.1 |
| $T_{str}$ | 676 | ~660 | 643 | 711 | 699 | 648 | 710 | 715 |
| α | 52.8 | ~52.5 | 52.2 | 50.4 | 54.6 | 50.4 | 57.5 | 50.3 |
| ρ | 2.674 | ~2.66 | 2.64 | 2.652 | 2.675 | 2.696 | 2.771 | 2.664 |
| $T_{liq}$ | 1120 | 1150 | 1135 | 1190 | | | | |
| $\eta_{liq}$ (kP) | | | 5.4 | | | | | |
| $T_{200}$ | | | 1360 | | | | | |

TABLE 10

| Mol % | Example | | | | | | | |
|---|---|---|---|---|---|---|---|---|
| | 59 | 60 | 61 | 62 | 63 | 64 | 65 | 66 |
| MgO | 5 | 5 | 10 | | 2.9 | 8.7 | 5.2 | 8.5 |
| CaO | 24 | 21 | 18 | 21 | 32.1 | 8.7 | 10.45 | 8.5 |
| SrO | 16 | 14 | 12 | 14 | | | 5.2 | |
| BaO | | | | | 2.9 | 8.65 | 5.2 | 8.4 |
| ZnO | | | | 5 | | | | |
| RO | 45 | 40 | 40 | 40 | 37.9 | 26.05 | 26.05 | 25.4 |
| $B_2O_3$ | 15 | 15 | 15 | 15 | | | | 2.5 |
| $Al_2O_3$ | 20 | 20 | 20 | 20 | 14.6 | 9.05 | 9.05 | 8.8 |
| $SiO_2$ | 20 | 25 | 25 | 25 | 47.4 | 64.8 | 64.8 | 63.2 |
| $SnO_2$ | | | | | 0.1 | 0.1 | 0.1 | 0.1 |
| $T_{str}$ | 619 | 620 | 621 | 606 | ~700 | 704 | 703 | ~680 |
| α | 73.7 | 70 | 67.3 | 69.9 | ~66 | 52.4 | 53.5 | ~52 |
| ρ | | | | | 2.885 | 2.865 | 2.853 | ~2.84 |
| $T_{liq}$ | | | | | | | | 1130 |
| $\eta_{liq}$ (kP) | | | | | | | | |
| $T_{200}$ | | | | | | | | |

TABLE 11

| Mol % | Example | | | | | | |
|---|---|---|---|---|---|---|---|
| | 67 | 68 | 69 | 70 | 71 | 72 | 73 | 74 |
| MgO | 8.3 | 8.05 | 5.1 | 4.95 | 4.8 | 2.7 | 2.6 | 4.1 |
| CaO | 8.3 | 8.05 | 10.15 | 9.9 | 9.6 | 2.9 | 2.0 | 9.9 |
| SrO | | | 5.1 | 4.95 | 4.8 | 11.8 | 9.6 | 3.3 |
| BaO | 8.2 | 8 | 5.1 | 4.95 | 4.8 | 0.7 | 3.6 | 2.2 |
| ZnO | | | | | | | | |
| RO | 24.7 | 24.1 | 25.4 | 24.7 | 24.1 | 18.0 | 17.7 | 19.4 |
| $B_2O_3$ | 5 | 7.5 | 2.5 | 5 | 7.5 | 9.0 | 7.5 | 9.7 |
| $Al_2O_3$ | 8.6 | 8.4 | 8.8 | 8.6 | 8.4 | 9.6 | 9.3 | 10.0 |
| $SiO_2$ | 61.6 | 59.9 | 63.2 | 61.6 | 59.9 | 63.3 | 65.4 | 60.8 |
| $SnO_2$ | 0.1 | 0.1 | 0.1 | 0.1 | 0.1 | 0.10 | 0.10 | 0.10 |
| $T_{str}$ | ~655 | 633 | ~680 | ~660 | 639 | 645 | 649 | 639 |
| α | ~51.5 | 51 | ~53 | ~53 | 53.1 | 46.2 | 46.5 | 46.5 |
| ρ | ~2.82 | 2.803 | ~2.82 | ~2.80 | 2.766 | 2.70 | 2.75 | 2.70 |
| $T_{liq}$ | 1125 | 1080 | 1135 | 1080 | 1140 | 1130 | 1110 | 1045 |
| $\eta_{liq}$ (kP) | | 25.1 | | 40.2 | | | | |
| $T_{200}$ | | 1383 | | 1420 | | | | |

TABLE 12

| Mol % | Example | | | | | | | |
|---|---|---|---|---|---|---|---|---|
| | 75 | 76 | 77 | 78 | 79 | 80 | 81 | 82 |
| MgO | 1.8 | 0 | 2.0 | 1.98 | 1.97 | 2.5 | 3.5 | 4.5 |
| CaO | 11.0 | 10.0 | 9.0 | 1.3 | 0.8 | 7.0 | 5.5 | 4.5 |
| SrO | 2.9 | 9.0 | 8.0 | 11.9 | 11.5 | 1.5 | 2.0 | 2.0 |
| BaO | 3.3 | 0 | 0 | 2.0 | 4.0 | 7.0 | 7.0 | 7.0 |
| ZnO | | | | | | | | |
| RO | 19.0 | 19.0 | 19.0 | 17.2 | 18.3 | 18.0 | 18.0 | 18.0 |
| $B_2O_3$ | 10.7 | 8.0 | 8.0 | 6.4 | 6.4 | 9.0 | 9.0 | 9.0 |
| $Al_2O_3$ | 8.5 | 9.0 | 9.0 | 8.7 | 8.6 | 9.0 | 9.0 | 9.0 |
| $SiO_2$ | 62.3 | 64.0 | 64.0 | 67.6 | 66.5 | 63.9 | 63.9 | 63.9 |
| $SnO_2$ | 0.07 | 0.10 | 0.10 | 0.17 | 0.17 | 0.10 | 0.10 | 0.10 |
| $T_{str}$ | 631 | 648 | 649 | 667 | 665 | 632 | 632 | 635 |
| α | 46.0 | 48.4 | 45.8 | 45.9 | 46.6 | 46.5 | 45.9 | 45.8 |
| ρ | | 2.67 | 2.63 | 2.72 | 2.77 | 2.73 | 2.72 | 2.72 |
| $T_{liq}$ | 1075 | 1150 | 1145 | 1100 | 1075 | 1050 | 1025 | 1020 |
| $\eta_{liq}$ (kP) | | | | 124 | 235 | 166 | 364 | 437 |
| $T_{200}$ | | | | 1563 | 1545 | 1490 | 1490 | 1494 |

TABLE 13

| Mol % | \multicolumn{7}{c}{Example} |
|---|---|---|---|---|---|---|---|
| | 83 | 84 | 85 | 86 | 87 | 88 | 89 |
| MgO | 3.8 | 3.9 | 1.8 | 0.0 | 2.0 | 2.0 | 2.0 |
| CaO | 6.0 | 5.7 | 11.0 | 10.0 | 9.0 | 1.3 | 0.8 |
| SrO | 2.2 | 2.5 | 2.9 | 9.0 | 8.0 | 11.9 | 11.5 |
| BaO | 7.6 | 6.2 | 3.3 | 0 | 0 | 2.0 | 4.0 |
| ZnO | | | | | | | |
| RO | 19.5 | 18.3 | 19.0 | 19.0 | 19.0 | 17.2 | 18.3 |
| $B_2O_3$ | 9.8 | 9.8 | 10.7 | 8.0 | 8.0 | 6.4 | 6.4 |
| $Al_2O_3$ | 9.8 | 9.9 | 8.5 | 9.0 | 9.0 | 8.6 | 8.6 |
| $SiO_2$ | 60.9 | 62.0 | 62.3 | 64.0 | 64.0 | 67.6 | 66.5 |
| $SnO_2$ | 0.10 | 0.10 | 0.07 | 0.10 | 0.10 | 0.17 | 0.17 |
| $T_{str}$ | 630 | 631 | 613 | 648 | 649 | 667 | 665 |
| α | 48.2 | 46.0 | 46 | 48.4 | 45.8 | 45.9 | 46.6 |
| ρ | 2.77 | 2.71 | | 2.67 | 2.63 | 2.72 | 2.77 |
| $T_{liq}$ | 1045 | | 1075 | 1150 | 1145 | 1100 | 1075 |
| $\eta_{liq}$ (kP) | 106 | | | | | 124 | 235 |
| $T_{200}$ | 1443 | | | | | 1563 | 1545 |

Example 2

Figure 3:
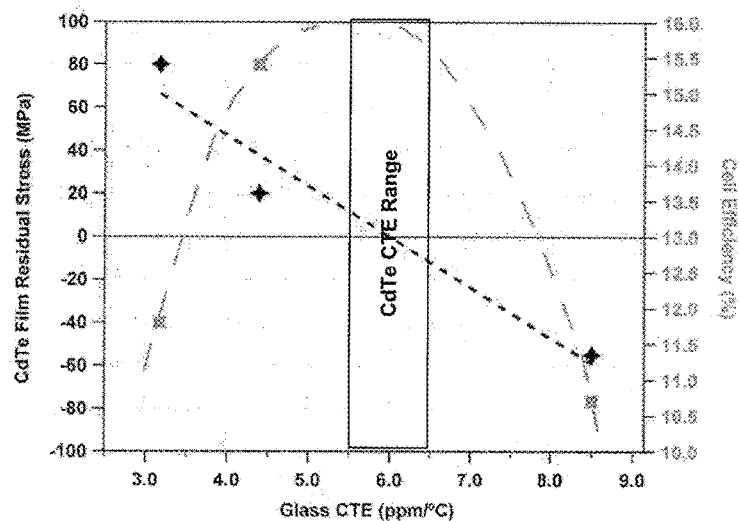
FIG. 3 shows the measured residual in-plane bulk stress of CdTe film versus CTE of glass is represented with black markers and the black dashed line is the linear fit. The corresponding device efficiency is represented by the blue marker. The shaded area represents the CTE range of a CdTe film. The dash black line shows the residual stress in the CdTe film trends towards a minimum as the glass CTE approaches the CTE of the CdTe film in the shaded area. The corresponding efficiency data points show the best performance for the device film with the lowest residual stress magnitude. This suggests higher efficiencies can be obtained using a glass superstrate with a CTE that is matched to that of the CdTe film.

An experiment was performed to empirically demonstrate the impact of residual stress on CdTe device performance using glass substrates with varying CTE. The experiment consisted of fabricating CdTe devices using the vapor transport deposition process on three different glass substrates having a CTE of 3.1, 4.3 and 8.5 ppm/° C., respectively. FIG. 3 summarizes the residual stress and the corresponding efficiencies for the CdTe devices fabricated on each of the three glass substrates. The efficiencies were calculated using the following equation:

$$Eff = V_{OC} \times J_{SC} \times FF$$

where the open circuit voltage VOC, the short circuit JSC and the fill factor FF are the device parameters that were extracted from the current-voltage behavior of each solar cell devices under AM1.5 irradiance at 25° C. The residual stress profile in the CdTe film was measured by glancing incidence x-ray diffraction over a range of (hkl) and at different incident beam angles. Uniform stress (σ) from a given direction (Ψ) results in uniform lattice strain (εΨ), which causes angular peak displacement, while non-uniform stress distorts peak shape. The measured strain is related to the applied stress by the elastic compliance coefficients. The in-plane strain-stress relationship for f.c.c. materials is:

$$\varepsilon_\Psi^{hkl} = \left(\frac{d_\Psi - d_0}{d_0}\right)^{hkl} = \sigma\left[\frac{(2S_{11} + 4S_{12} - S_{44})}{3} + \left(\frac{S_{44}}{2}\right)\sin^2\Psi\right]$$

The CdTe compliance coefficients are $S_{11}$=4.25×10−11 Pa, $S_{12}$=−1.73×10−11 Pa, and $S_{44}$=5.02×10−11 Pa. The measured (hkl) peak positions were reduced to the substrate reference frame and the residual stress associated with each peak was calculated.

To explain the results, we first we note that the CTE of the CdTe film can range from ~5.5 to ~6.5 ppm/° C. and is largely influenced by the CdTe deposition process which was noted earlier in this case to be by vapor transport. By convention, negative stress indicates in-plane compression (tension normal to substrate) and positive stress indicates in-plane tension (compression normal to substrate). The CdTe film deposited on the 8.5 ppm/° C. CTE glass is relatively relaxed at the surface and under significant in-plane compression within the film. The CdTe film deposited on the 4.3 ppm/° C. CTE substrate is under in-plane tension at the exposed surface and become more relaxed within the bulk, but with slight in-plane tension. The CdTe film deposited on the 3.1 ppm/° C. CTE substrate exhibit mixed stress at the surface and is under in-plane tension in the bulk. The mean residual bulk stress for this set of samples exhibits a linear correlation with glass CTE. The intercept CTE for which no strain is expected in this case is ~6 ppm/° C. The corresponding efficiency indicates a trend of increased efficiency as the residual stress magnitude decreases as illustrated by the grey dashed trace. This suggests a CdTe device with no residual stress in the film will exhibit optimum solar cell conversion efficiency.

Figure 5:
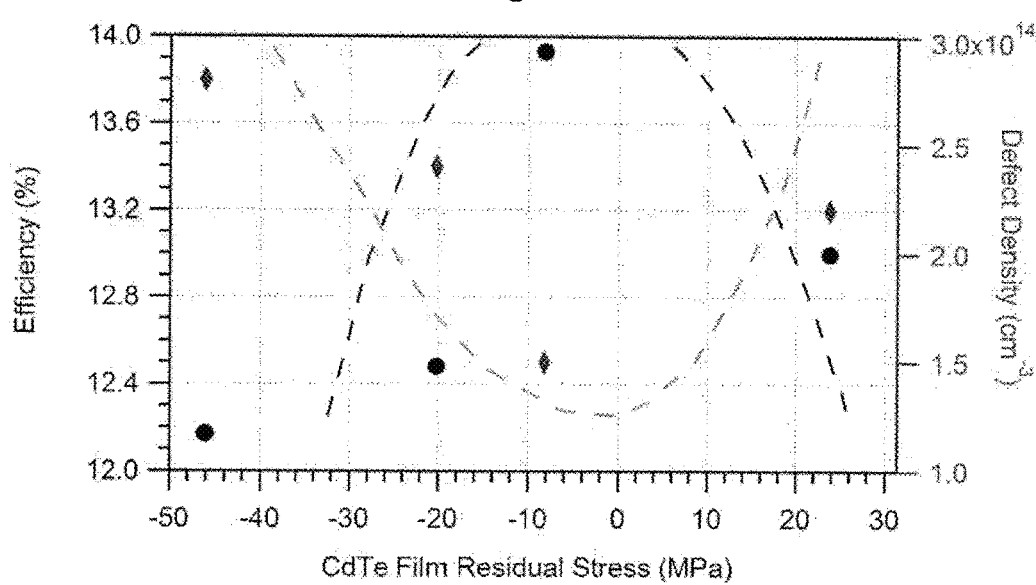
FIG. 5 is a graph of the efficiency and corresponding defect density as a function of the CdTe film residual stress for the same devices in FIG. 4.

To further illustrate the impact of the substrate CTE on CdTe solar cell device performance, another experiment was performed to empirically demonstrate the impact of residual stress on CdTe device performance using glass substrates with varying CTE. In this case, the experiment consisted of fabricating CdTe devices using the close spaced sublimation deposition process on glass substrates with CTE of 4.1, 5.8, 6.6 and 8.6 ppm/° C., respectively. Unlike the earlier described experiment, the glass substrates in this experiment were from the same alkali-free composition family so as to limit/mitigate any non-intended variables that could influence the experiment outcome. FIG. 5 summarizes the residual stress and the corresponding efficiencies for the CdTe devices fabricated on each of the glass substrates. As in FIG. 3, here we also observe the mean residual bulk stress for this set of samples exhibits a linear correlation with glass CTE. In this case, the intercept CTE for which no strain is expected is ~5.5 ppm/° C. And again, the corresponding efficiency indicates a trend of increased efficiency as the residual stress magnitude decreases as illustrated by the dashed trace.

Figure 4:
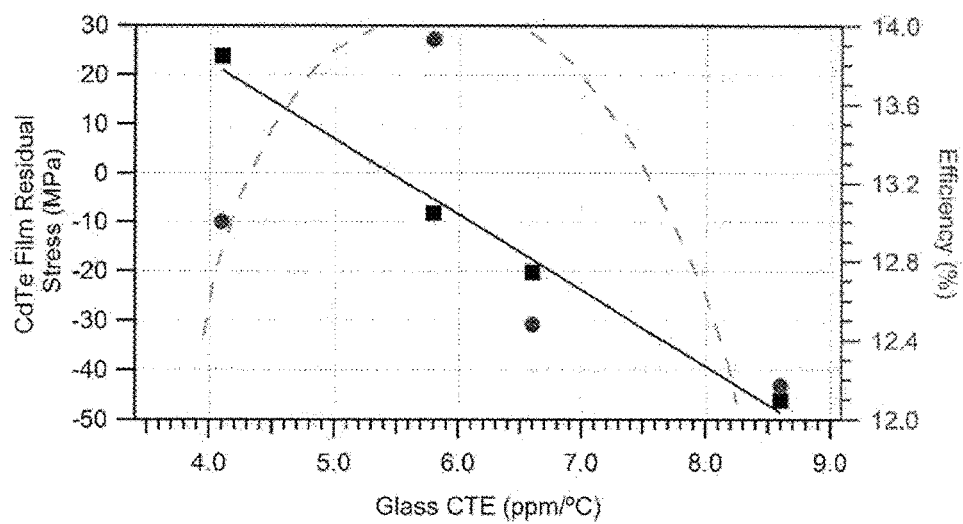
FIG. 4 is a graph of the CdTe film residual stress and corresponding efficiencies for devices fabricated using the close spaced sublimation process on glass substrates with varying CTE.

Stress and strain are known to cause microstructural defects in semiconductor films that can degrade the electrical performance of devices made thereafter in the film. In the case of CdTe solar cells, it is suggested that the defect density in the CdTe film follows a direct trend with the residual stress magnitude in the film: higher residual stress leads to higher defect density. Higher defect density then leads to higher recombination losses in the bulk of the film which then leads to lower open circuit $V_{OC}$. Lower $V_{OC}$ then leads to a lower efficiency. To this point, the devices summarized in FIG. 4 received additional characterization to demonstrate the impact of CdTe film defect density on the corresponding solar cell efficiency. The carrier concentration was calculated from the capacitance-voltage measurement that was performed on each solar cell device. The carrier concentration profile was then mapped into a device model that was constructed within the framework of a 2-D physics-based semiconductor device model from SILVACO TCAD software. The defect density was then extracted by fitting the measured current density-voltage curves. FIG. 5 shows the efficiency and the corresponding extracted defect density as a function of the CdTe film residual stress for the same devices in FIG. 4. Using the dashed lines as a guide, it can be shown that the defect density approaches minimum and the efficiency approaches optimum where the magnitude of the residual stress in the CdTe film is minimal.

The alkalis in the glass and low melting temperature combine to accelerate melting thus enabling high volume, low-cost melting and forming relative to alkali-free alternatives while retaining competitive properties, including in particular mechanical and dimensional stability when reheated to high temperature. These glasses are well suited for large-volume sheet glass applications, particularly OLED lighting and cadmium telluride (CdTe) photovoltaics, for which thermal stability, large volumes, and low cost are desirable substrate attributes.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A glass comprising about, in mol %:
60-65 $SiO_2$
5-15 $Al_2O_3$
4-11 $B_2O_3$
0-5 MgO
less than 7 CaO
0-12 SrO
0-8 BaO and
9-35 RO,
wherein the glass comprises no purposefully added $M_2O$, and wherein M is an alkali metal and wherein R is an alkaline earth metal.

2. The glass of claim 1, comprising about 61-64 mol % $SiO_2$.

3. The glass of claim 1, comprising about 8-11 mol % $Al_2O_3$.

4. The glass of claim 1, comprising zero mole percent $M_2O$.

5. The glass of claim 1, further comprising less than 2 mol % of $TiO_2$, MnO, ZnO, $Nb_2O_5$, $MoO_3$, $Ta_2O_5$, $WO_3$, $ZrO_2$, $Y_2O_3$, $La_2O_3$, $HfO_2$, CdO, $SnO_2$, $Fe_2O_3$, $CeO_2$, $As_2O_3$, $Sb_2O_3$, Cl, Br, $P_2O_5$, or combinations thereof.

6. The glass of claim 1, wherein the glass satisfies the ratio:

$$0.4 \leq (CaO\ (mol\ \%))/(CaO\ (mol\ \%)+SrO\ (mol\ \%)) \leq 1.0.$$

7. The glass of claim 1, wherein the glass has a coefficient of thermal expansion of from about 4.0 to about 7.5 ppm/° C. from 25 to 300° C.

8. The glass of claim 7, wherein the glass has a coefficient of thermal expansion of from about 4.0 to about 6.5 ppm/° C. from 25 to 300° C.

9. The glass of claim 8, wherein the glass has a coefficient of thermal expansion of from about 4.0 to about 6.0 ppm/° C. from 25 to 300° C.

10. The glass of claim 1, wherein the glass is in the form of a glass sheet having a thickness of 2.0 mm or less.

11. The glass of claim 10, further comprising a transparent conductive oxide on at least one side of the glass sheet.

12. The glass of claim 10, wherein the glass is thermally tempered.

13. An article comprising the glass of claim 1.

14. The article of claim 13, wherein the article comprises an electronic device.

15. The electronic device of claim 14, wherein the device comprises a photovoltaic, photochromic, electrochomic, or organic light emitting diode device.

* * * * *

UNITED STATES PATENT AND TRADEMARK OFFICE
CERTIFICATE OF CORRECTION

PATENT NO. : 10,196,297 B2
APPLICATION NO. : 15/013417
DATED : February 5, 2019
INVENTOR(S) : Bruce Gardiner Aitken et al.

Page 1 of 1

It is certified that error appears in the above-identified patent and that said Letters Patent is hereby corrected as shown below:

In the Claims

In Column 38, Line 37 approx., Claim 15, delete "electrochomic," and insert -- electrochromic, --, therefor.

Signed and Sealed this
Twenty-sixth Day of May, 2020

Andrei Iancu
*Director of the United States Patent and Trademark Office*